US010803944B2

(12) United States Patent
Morooka et al.

(10) Patent No.: US 10,803,944 B2
(45) Date of Patent: *Oct. 13, 2020

(54) ARCHITECTURE FOR 3-D NAND MEMORY

(71) Applicant: Micron Technology, Inc., Boise, ID (US)

(72) Inventors: Midori Morooka, Yokohama (JP); Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/378,090

(22) Filed: Apr. 8, 2019

(65) Prior Publication Data

US 2020/0005869 A1    Jan. 2, 2020

Related U.S. Application Data

(63) Continuation of application No. 14/626,540, filed on Feb. 19, 2015, now Pat. No. 10,269,429, which is a continuation of application No. 13/524,872, filed on Jun. 15, 2012, now Pat. No. 8,964,474.

(51) Int. Cl.
*G11C 11/34* (2006.01)
*G11C 16/04* (2006.01)
*G11C 16/34* (2006.01)
*G11C 16/06* (2006.01)

(52) U.S. Cl.
CPC .......... *G11C 16/0483* (2013.01); *G11C 16/06* (2013.01); *G11C 16/3427* (2013.01); *G11C 2213/71* (2013.01)

(58) Field of Classification Search
CPC .................................... G11C 16/00

USPC .................................................. 365/185.17
See application file for complete search history.

(56) References Cited

U.S. PATENT DOCUMENTS

| | | |
|---|---|---|
| 3,825,907 A | 7/1974 | Sell et al. |
| 4,811,082 A | 3/1989 | Jacobs et al. |
| 5,732,018 A | 3/1998 | Choi et al. |
| 5,805,498 A | 9/1998 | Lee et al. |
| 6,621,735 B2 | 9/2003 | Nakamura et al. |
| 7,554,832 B2 | 6/2009 | Fasoli et al. |
| 7,852,676 B2 | 12/2010 | Maejima |
| 7,859,902 B2 | 12/2010 | Maejima |
| 8,681,555 B2 | 3/2014 | Liu |

(Continued)

FOREIGN PATENT DOCUMENTS

| | | |
|---|---|---|
| CN | 101853858 A | 10/2010 |
| CN | 103620781 A | 3/2014 |

(Continued)

OTHER PUBLICATIONS

"U.S. Appl. No. 13/096,822, Non Final Office Action dated Nov. 21, 2013", 18 pgs.

(Continued)

*Primary Examiner* — Min Huang
(74) *Attorney, Agent, or Firm* — Schwegman Lundberg & Woessner, P.A.

(57) ABSTRACT

Apparatuses are described that include stacked arrays of memory cell strings and their methods of operation. Apparatuses include architectures that reduce the use of several common components, allowing greater device density and smaller device size for a given semiconductor area.

20 Claims, 19 Drawing Sheets

(56) References Cited

U.S. PATENT DOCUMENTS

| | | | |
|---|---|---|---|
| 8,709,894 B2 | 4/2014 | Lee et al. | |
| 8,860,117 B2 | 10/2014 | Tanzawa | |
| 8,964,474 B2* | 2/2015 | Morooka | G11C 16/3427 |
| | | | 365/185.17 |
| 8,984,214 B2 | 3/2015 | Chen et al. | |
| 9,076,528 B2 | 7/2015 | Porterfield | |
| 9,128,637 B2 | 9/2015 | Manning | |
| 9,152,512 B2 | 10/2015 | Cronin et al. | |
| 9,165,653 B2 | 10/2015 | Asnaashari et al. | |
| 9,170,898 B2 | 10/2015 | Porterfield | |
| 9,437,610 B2 | 9/2016 | Maejima | |
| 9,679,650 B1 | 6/2017 | Sakui | |
| 9,704,876 B2 | 7/2017 | Tanzawa | |
| 10,074,431 B2 | 9/2018 | Sakui | |
| 10,269,429 B2* | 4/2019 | Morooka | G11C 16/3427 |
| 10,510,414 B2 | 12/2019 | Sakui et al. | |
| 2005/0226049 A1 | 10/2005 | Jeong et al. | |
| 2006/0126397 A1 | 6/2006 | Tanishima | |
| 2006/0146608 A1 | 7/2006 | Fasoli et al. | |
| 2006/0203547 A1 | 9/2006 | Takeuchi | |
| 2006/0245249 A1 | 11/2006 | Hwang | |
| 2007/0161162 A1 | 7/2007 | Jeng | |
| 2007/0252201 A1 | 11/2007 | Kito et al. | |
| 2008/0099819 A1 | 5/2008 | Kito et al. | |
| 2008/0180994 A1 | 7/2008 | Katsumata et al. | |
| 2008/0303083 A1 | 12/2008 | Oyu | |
| 2009/0161474 A1 | 6/2009 | Scheuerlein et al. | |
| 2009/0168534 A1 | 7/2009 | Park et al. | |
| 2009/0224330 A1 | 9/2009 | Hong et al. | |
| 2009/0267139 A1 | 10/2009 | Maejima | |
| 2009/0268522 A1 | 10/2009 | Maejima | |
| 2009/0268524 A1 | 10/2009 | Maejima | |
| 2010/0109071 A1 | 5/2010 | Tanaka et al. | |
| 2010/0177566 A1 | 7/2010 | Kim et al. | |
| 2010/0181612 A1 | 7/2010 | Kito et al. | |
| 2010/0207185 A1 | 8/2010 | Lee et al. | |
| 2010/0207186 A1 | 8/2010 | Higashi et al. | |
| 2010/0214838 A1 | 8/2010 | Hishida et al. | |
| 2010/0226195 A1 | 9/2010 | Lue | |
| 2010/0238732 A1 | 9/2010 | Hishida et al. | |
| 2010/0270529 A1 | 10/2010 | Lung | |
| 2010/0270593 A1 | 10/2010 | Lung et al. | |
| 2010/0314678 A1 | 12/2010 | Lim et al. | |
| 2010/0315881 A1 | 12/2010 | Kim et al. | |
| 2010/0320526 A1 | 12/2010 | Kidoh et al. | |
| 2010/0320528 A1 | 12/2010 | Jeong et al. | |
| 2010/0321981 A1* | 12/2010 | Jeon | G11C 7/12 |
| | | | 365/148 |
| 2010/0321984 A1 | 12/2010 | Rahim et al. | |
| 2010/0321998 A1 | 12/2010 | Jang | |
| 2010/0322000 A1 | 12/2010 | Shim et al. | |
| 2010/0327339 A1 | 12/2010 | Tanaka et al. | |
| 2011/0013454 A1 | 1/2011 | Hishida et al. | |
| 2011/0049611 A1 | 3/2011 | Kiyotoshi et al. | |
| 2011/0063916 A1 | 3/2011 | Maeda | |
| 2011/0169071 A1 | 7/2011 | Uenaka et al. | |
| 2011/0182105 A1 | 7/2011 | Yan et al. | |
| 2011/0216603 A1 | 9/2011 | Han et al. | |
| 2011/0249503 A1 | 10/2011 | Yamada et al. | |
| 2011/0286283 A1* | 11/2011 | Lung | G11C 16/0483 |
| | | | 365/185.28 |
| 2012/0273862 A1 | 11/2012 | Tanzawa | |
| 2013/0336065 A1 | 12/2013 | Morooka et al. | |
| 2015/0021609 A1 | 1/2015 | Tanzawa | |
| 2015/0162084 A1 | 6/2015 | Morooka et al. | |
| 2015/0262682 A1 | 9/2015 | Futatsuyama et al. | |
| 2015/0380097 A1 | 12/2015 | Sato et al. | |
| 2016/0064088 A1 | 3/2016 | Shiga et al. | |
| 2017/0309641 A1 | 10/2017 | Tanzawa | |
| 2017/0330626 A1 | 11/2017 | Sakui | |
| 2018/0358096 A1 | 12/2018 | Sakui | |
| 2020/0160913 A1 | 5/2020 | Sakui | |

FOREIGN PATENT DOCUMENTS

| | | |
|---|---|---|
| CN | 201280028890.6 | 2/2017 |
| EP | 2702610 B1 | 9/2016 |
| JP | 2001298194 A | 10/2001 |
| JP | 2009212280 A | 9/2009 |
| JP | 2010114113 A | 5/2010 |
| JP | 2010165794 A | 7/2010 |
| JP | 2010166055 A | 7/2010 |
| JP | 2010187001 A | 8/2010 |
| KR | 20060100993 A | 9/2006 |
| KR | 20100003629 A | 1/2010 |
| KR | 1020100003629 A | 1/2010 |
| KR | 10-1865169 | 5/2018 |
| TW | 381267 B | 2/2000 |
| TW | 200710851 A | 3/2007 |
| TW | 201308577 A | 2/2013 |
| TW | 201407630 A | 2/2013 |
| TW | I524356 B | 3/2016 |
| TW | 201612899 A | 4/2016 |
| TW | 201905907 A | 2/2019 |
| WO | WO-2012149424 A2 | 11/2012 |
| WO | WO-2012149424 A3 | 11/2012 |
| WO | WO-2013188399 A1 | 12/2013 |

OTHER PUBLICATIONS

"Chinese Application Serial No. 201280028890.6, Office Action dated Apr. 21, 2016", W/ English Translation, 12 pgs.

"Chinese Application Serial No. 201280028890.6, Office Action dated Oct. 12, 2015", W/ English Translation, 8 pgs.

"Chinese Application Serial No. 201280028890.6, Response filed Jan. 4, 2016 to Office Action dated Oct. 12, 2015", W/ English Claims, 26 pgs.

"Chinese Application Serial No. 201280028890.6, Response filed Jul. 5, 2016 to Office Action dated Apr. 21, 2016", W/ English Claims, 27 pgs.

"Chinese Application Serial No. 201710001454.4, Office Action dated Jul. 30, 2018", W/ English Translation, 12 pgs.

"Chinese Application Serial No. 201710001454.4, Response Filed Feb. 14, 2019 to Office Action dated Jul. 30, 2018", w/English Claims, 18 pgs.

"European Application Serial No. 12776549.3 Response filed Mar. 10, 2015 to Extended European Search Report dated Mar. 10, 2015", 18 pgs.

"European Application Serial No. 12776549.3, Communication under Rule 71(3) dated Mar. 31, 2016", 59 pgs.

"European Application Serial No. 12776549.3, Extended European Search Report dated Oct. 14, 2014", 6 pgs.

"European Application Serial No. 12776549.3, Preliminary Amendment filed Jun. 11, 2014", 9 pgs.

"International Application Serial No. PCT/US2012/035596, International Preliminary Report on Patentability dated Nov. 7, 2013", 8 pgs.

"International Application Serial No. PCT/US2012/035596, International Search Report dated Jan. 10, 2013", 5 pgs.

"International Application Serial No. PCT/US2012/035596, Invitation to Pay Additional Fees and Partial Search Report dated Nov. 26, 2012", 7 pgs.

"International Application Serial No. PCT/US2012/035596, Written Opinion dated Jan. 10, 2013", 6 pgs.

"International Application Serial No. PCT/US2013/045173, International Preliminary Report on Patentability dated Dec. 24, 2014", 8 pgs.

"International Application Serial No. PCT/US2013/045173, International Search Report dated Sep. 26, 2013", 3 pgs.

"International Application Serial No. PCT/US2013/045173, Written Opinion dated Sep. 26, 2013", 6 pgs.

"Japanese Application Serial No. 2014-508138, Non Final Office Action dated Oct. 13, 2015", W/ English Translation, 10 pgs.

"Japanese Application Serial No. 2014-508138, Office Action dated May 19, 2015", w/English Translation, 9 pgs.

(56) References Cited

OTHER PUBLICATIONS

"Japanese Application Serial No. 2014-508138, Response Filed Jan. 7, 2016 to Non Final Office Action dated Oct. 13, 2015", w/English Translation, 7 pgs.

"Japanese Application Serial No. 2014-508138, Response filed Aug. 10, 2015 to Office Action dated May 19, 2015", W/ English Claims, 14 pgs.

"Korean Application Serial No. 10-2013-7031681, Office Action dated Jun. 29, 2017", W/ English Translation, 34 pgs.

"Korean Application Serial No. 10-2013-7031681, Response filed Nov. 28, 2017 for Office Action dated Jun. 29, 2017", w/English Claims, 31 pgs.

"Korean Application Serial No. 10-2018-7015490, Notice of Preliminary Rejection dated Feb. 27, 2019", w/English Translation, 20 pgs.

"Taiwanese Application Serial No. 101115256, Amendment filed Apr. 9, 2015", w/English Claims.

"Taiwanese Application Serial No. 101115256, Decision of Rejection dated May 9, 2016", W/ English Translation, 6 pgs.

"Taiwanese Application Serial No. 101115256, Office Action dated Sep. 14, 2015", W/ English Translation, 7 pgs.

"Taiwanese Application Serial No. 101115256, Response filed Mar. 15, 2016 to Office Action dated Sep. 14, 2015", w/English Claims, 38 pgs.

"Taiwanese Application Serial No. 102121223, Office Action dated Aug. 13, 2015", W/ English Translation, 3 pgs.

"Taiwanese Application Serial No. 102121223, Response filed Nov. 12, 2015 to Office Action dated Aug. 13, 2015", W/ English Claims, 14 pgs.

"Taiwanese Application Serial No. 102121223, Supplemental Voluntary Amendment filed Jul. 2, 2015", W/ English Claims, 7 pgs.

"Taiwanese Application Serial No. 102121223, Voluntary Amendment filed Apr. 3, 2014", W/ English Claims, 36 pgs.

"Taiwanese Application Serial No. 1041143893, Response filed May 22, 2017 to Office Action dated Feb. 18, 2017", w/English Translation, 36 pgs.

"Taiwanese Application Serial No. 104143893, Office Action dated Feb. 18, 2017", w/English Translation, 13 pgs.

"Taiwanese Application Serial No. 104143893, Office Action dated May 7, 2018", w/English Translation, 19 pgs.

"Taiwanese Application Serial No. 104143893, Office Action dated Oct. 18, 2017", w/English Translation, 8 pgs.

"Taiwanese Application Serial No. 104143893, Response filed Jan. 19, 2018 to Office Action dated Oct. 18, 2017", w/English Claims, 37 pgs.

"Taiwanese Application Serial No. 104143893, Response filed Aug. 9, 2018 to Office Action dated May 7, 2018", w/ English Claims, 36 pgs.

"Taiwanese Application Serial No. 107136222, First Office Action dated Apr. 12, 2019", w/ English translation, 14 pgs.

"Taiwanese Application Serial No. 107136222, Response filed Jul. 12, 2019 to First Office Action dated Apr. 12, 2019", w/ English Claims, 36 pgs.

Chiang, M H, et al., "Novel High-Density Low-Power Logic Circuit Techniques Using DG Devices", IEEE ED, 52(10), (2005), 2339-42.

Crowley, Matthew, et al., "512 Mb PROM with 8 layers of antifuse/diode cells", 2003 IEEE International Solid-State Circuits Conference, 2003. Digest of Technical Papers. ISSCC, (2003), 284-293.

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a three-dimensional array of diode/antifuse memory cells", IEEE Journal of Solid-State Circuits, 38(11), (2003), 1920-1928.

Katsumata, R., et al., "Pipe-shaped BiCS flash memory with 16 stacked layers and multilevel-cell operation for ultra high density storage devices", Symposium on VLSI Technology, (Jun. 2009), 136-37.

Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.

Kim, W., et al., "Multi-layered Vertical Gate NAND Flash overcoming stacking limit for terabit density storage", Symposium on VLSI Technology, (2009), 188-89.

Park, Ki-Tae, et al., "A 7MB/s 64Gb 3-Bit/Cell DDR NAND Flash Memory in 20nm-Node Technology", ISSCC 2011 / Session 11 / Non-Volatile Memory Solutions / 11.8, 2011 IEEE International Solid-State Circuits Conference (Digest of Technical Papers), (Feb. 22, 2011), 212-213.

Sakui, K, et al., "Design Impacts on NAND Flash Memory Core Circuits with Vertical MOSFETs", IEEE International Memory Workshop (IMW), (May 2010), 1-4.

Tanaka, H., et al., "Bit Cost Scalable Technology with Punch and Plug Process for Ultra High Density Flash Memory", IEEE Symposium on VLSI Technology, (2007), 14-15.

* cited by examiner

ARCHITECTURE FOR 3-D NAND MEMORY

PRIORITY APPLICATION

This application is a continuation of U.S. application Ser. No. 14/626,540, filed Feb. 19, 2015, which is a continuation of U.S. application Ser. No. 13/524,872, filed Jun. 15, 2012, now issued as U.S. Pat. No. 8,964,474, all of which are incorporated herein by reference in their entireties.

BACKGROUND

Memory devices, such as flash memory, are widely used in computers and electronic products. Such memory devices usually have a memory array with numerous memory cells to store information. These memory devices also have circuitry to transfer information to and from the memory array. Information can be stored into the memory cells in a programming operation. The stored information can be retrieved in a read operation or can be cleared in an erase operation. In semiconductor memories, there is continuous pressure to reduce component dimensions and fit more components in a given amount of chip area. As dimensions shrink, various technical hurdles become more significant.

DETAILED DESCRIPTION

In the following detailed description of various embodiments of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and structural, logical, and electrical changes may be made.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
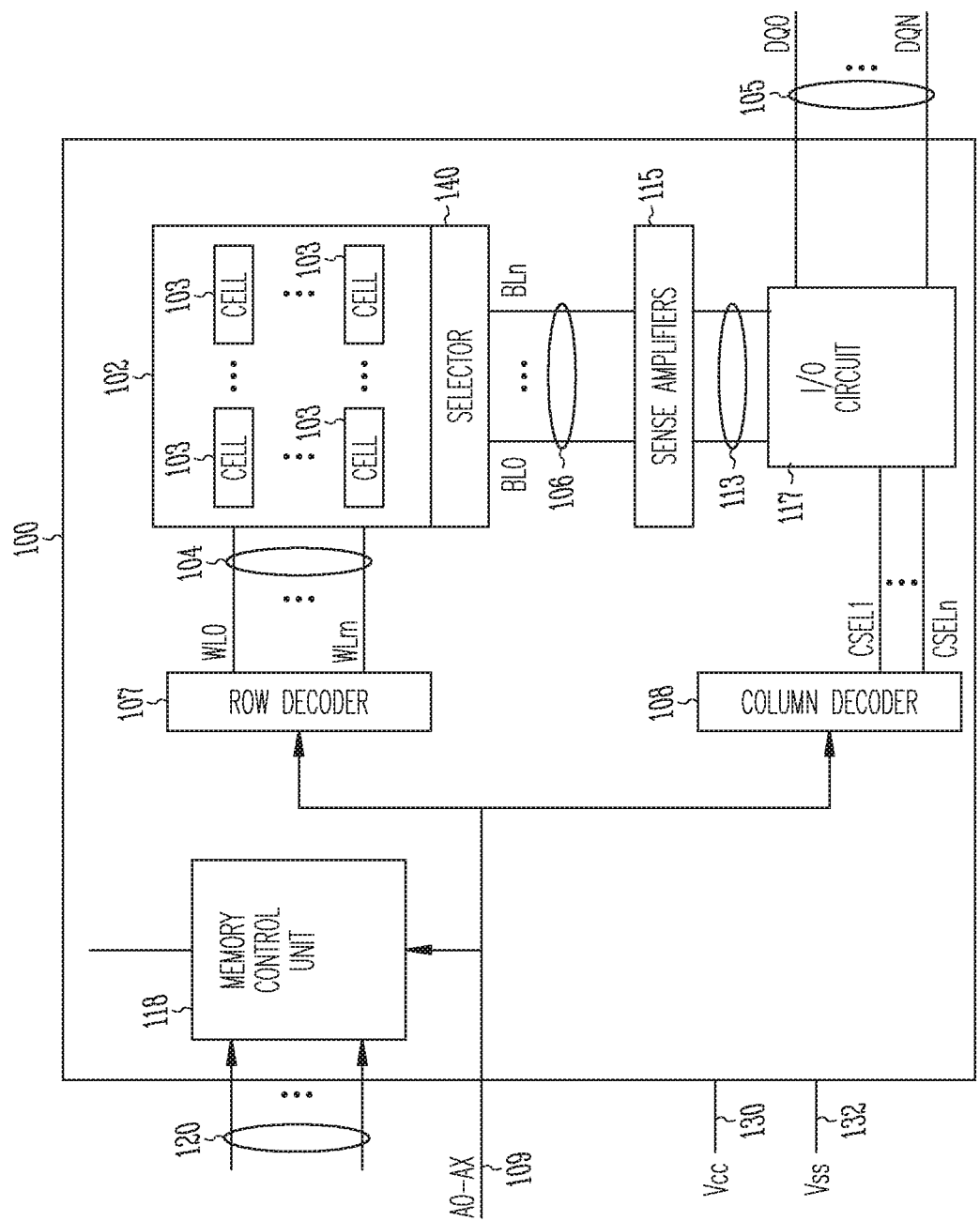
FIG. 1 shows a block diagram of a memory device according to an embodiment of the invention.

FIG. 1 shows a block diagram of an apparatus in the form of a memory device 100, having a memory array 102 with memory cells 103, according to an embodiment of the invention. Memory cells 103 can be arranged in rows and columns along with lines 104 and lines 106. Lines 104 can carry signals WL0 through WLm and can form part of access (e.g., word) lines of memory device 100. Lines 106 can carry signals BL0 through BLn and can form part of data lines (e.g., bit lines) of memory device 100.

Memory device 100 may use lines 104 to access memory cells 103 and lines 106 to exchange information (e.g., via signals provided on the lines 106) with memory cells 103. A row decoder 107 and a column decoder 108 decode address signals A0 through AX on lines 109 (e.g., address lines) to determine which memory cells 103 are to be accessed in a memory operation.

Memory device 100 can perform memory operations, such as a read operation to read information from memory cells 103, and a write (e.g., programming) operation to write (e.g., program) information into memory cells 103. Memory device 100 can also perform an erase operation to clear information from some or all of memory cells 103.

A memory control unit 118 controls memory operations of the memory device 100 based on control signals on lines 120. Examples of the control signals on lines 120 include one or more clock signals and other signals to indicate which operation (e.g., read, programming, or erase operation) memory device 100 is to perform.

Other devices external to memory device 100 (e.g., a memory access device, such as a processor or a memory controller) can control the values of the control signals on lines 120. Specific values of a combination of the signals on lines 120 can produce a command (e.g., read, programming, or erase command) that can cause memory device 100 to perform a corresponding memory operation (e.g., read, programming, or erase operation).

Memory device 100 can include a selector 140 such as one or more select gates, configured to selectably couple memory cells 103 associated with lines 106 to sense circuits, such as data detectors 115, in a memory operation, such as a read operation. Selector 140 and memory cells 103 can be physically located in the same memory array 102. A portion of the memory array 102 can include memory cells 103 to store information. Another portion of memory array 102 can include the selector 140.

Data detectors 115 are configured to determine the value of information from memory cells 103 in a memory operation, such as a read operation, and provides the information in the form of signals to lines 113 (e.g., data lines). Data detectors 115 can also use the signals on lines 113 to determine the value of information to be written (e.g., programmed) into memory cells 103.

Memory device 100 can include an input/output (I/O) circuit 117 to exchange information between memory array 102 and lines (e.g., I/O lines) 105. Signals DQ0 through DQN on lines 105 can represent information read from or to be written into memory cells 103. Lines 105 can include nodes within memory device 100 or pins (or solder balls, etc.) on a package where memory device 100 can reside. Other devices external to memory device 100 (e.g., a memory controller or a processor) can communicate with memory device 100 through lines 105, 109, and 120.

I/O circuit 117 can respond to signals cSEL1 through cSELn to select the signals on lines 113 that cart represent the information read from or programmed into memory cells 103. Column decoder 108 can selectably activate the CSEL1 through CSELn signals based on the A0 through AX address signals on lines 109. I/O circuit 117 can select the signals on lines 113 to exchange information between memory array 102 and lines 105 during read and programming operations.

Each of memory cells 103 can be programmed to store information representing a value of a fraction of a bit, a value of a single bit or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value representing multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can be configured to receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a non-volatile memory device and memory cells 103 can include non-volatile memory cells, such that memory cells 103 can retain information stored thereon when power (e.g., Vcc, Vss, or both) is disconnected from memory device 100. For example, memory device 100 may comprise a flash memory device, such as a NAND flash or a NOR flash memory device, and/or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the embodiments described herein.

Memory device 100 may include memory devices and operate using memory operations (e.g., read, programming, and erase operations) similar to or identical to the memory devices and operations described below with reference to FIG. 2 through FIG. 18.

Figure 2:
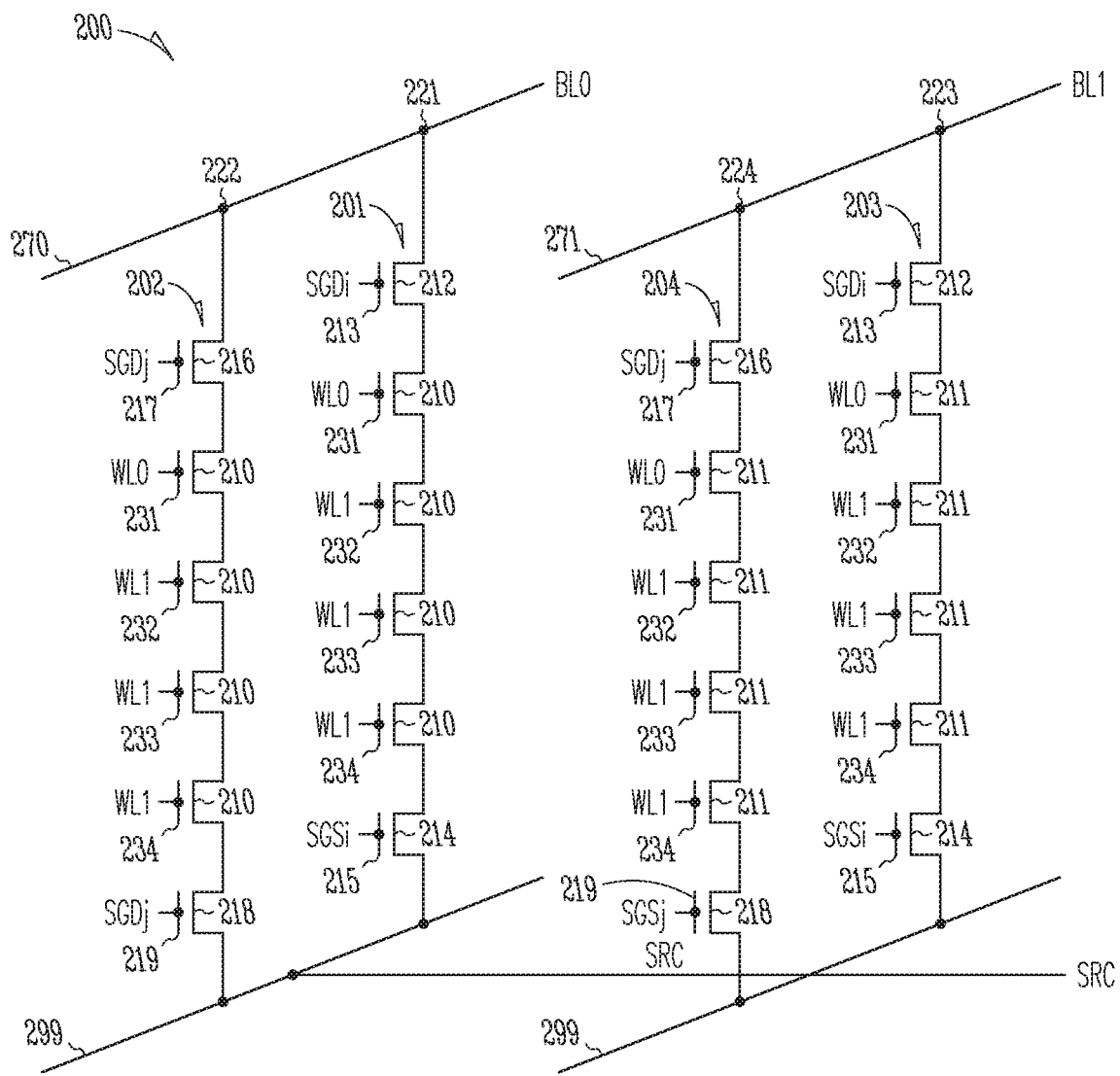
FIG. 2 shows a schematic diagram of a memory string device example according to an embodiment of the invention.

FIG. 2 shows a schematic diagram of a portion of a memory device 200 including memory cell strings 201, 202, 203, and 204, according to an embodiment of the invention. Memory device 200 can be associated with memory device 100 of FIG. 1, such as forming a portion of the memory array 102 of memory device 100.

As shown in FIG. 2, memory cell strings 201 and 202 can be coupled to line 270 at nodes 221 and 222, respectively. Memory cell strings 203 and 204 can be coupled to line 271 at nodes 223 and 224, respectively. Each of the memory cell strings 201, 202, 203, and 204 can also be coupled to line 299, which can be coupled to a line associated with a source (SRC).

Lines 270 and 271 can be structured as conductive lines and can form part of the data lines (e.g., bit lines) of memory device 200 to carry signals BL0 and BL1, respectively. Line 299 can be structured as a conductive line and can form a part of a source line of the memory device 200 that carries signal SRC.

As shown in FIG. 2, memory cell string 201 can include memory cells 210 with associated gates 231, 232, 233, and 234, and transistors 212 and 214 with associated gates 213 and 215. Memory cell string 202 can include memory cells 210 with associated gates 231, 232, 233, and 234, and transistors 216 and 218 with associated gates 217 and 219. Memory cell string 203 can include memory cells 211 with associated gates 231, 232, 233, and 234, and transistors 212 and 214 with associated gates 213 and 215. Memory cell string 204 can include memory cells 211 with associated gates 231, 232, 233, and 234, and transistors 216 and 218 with associated gates 217 and 219.

The memory cells (210 or 211) in each of memory cell strings 201, 202, 203, and 204 can be stacked over each other in multiple levels of the memory device 200 over a substrate (e.g., a semiconductor substrate) of the memory device 200.

Gates 213 of memory cell strings 201 and 203 can be coupled together to carry the same signal SGDi. Gates 217 of memory cell strings 202 and 204 can be coupled together to carry the same signal SGDj. Signals SGDi and SGDj can be two different signals.

Gates 215 of memory cell strings 201 and 203 can be coupled together to carry the same signal SGSi. Gates 219 of memory cell strings 202 and 204 can be coupled together to carry the same signal SGSj. Signals SGSi and SGSj can be two different signals.

Gates 231 of memory cell strings 201, 202, 203, and 204 can be coupled together to carry the same signal WL0. Gates 232 of memory cell strings 201, 202, 203, and 204 can be coupled together to carry the same signal WL1. Gates 233 of memory cell strings 201, 202, 203, and 204 can be coupled together carry the same signal WL2. Gates 234 of memory cell strings 201, 202, 203, and 204 can be coupled together to carry the same signal WL3.

FIG. 2 shows an example of two lines (e.g., 270 and 271) and two memory cell strings coupled to each line with each string having four memory cells. The number of lines, memory cell strings, and memory cells in each memory cell strings may vary. For example, a memory cell string may be configured with eight memory cells in each string, as shown in examples below.

Figure 3:
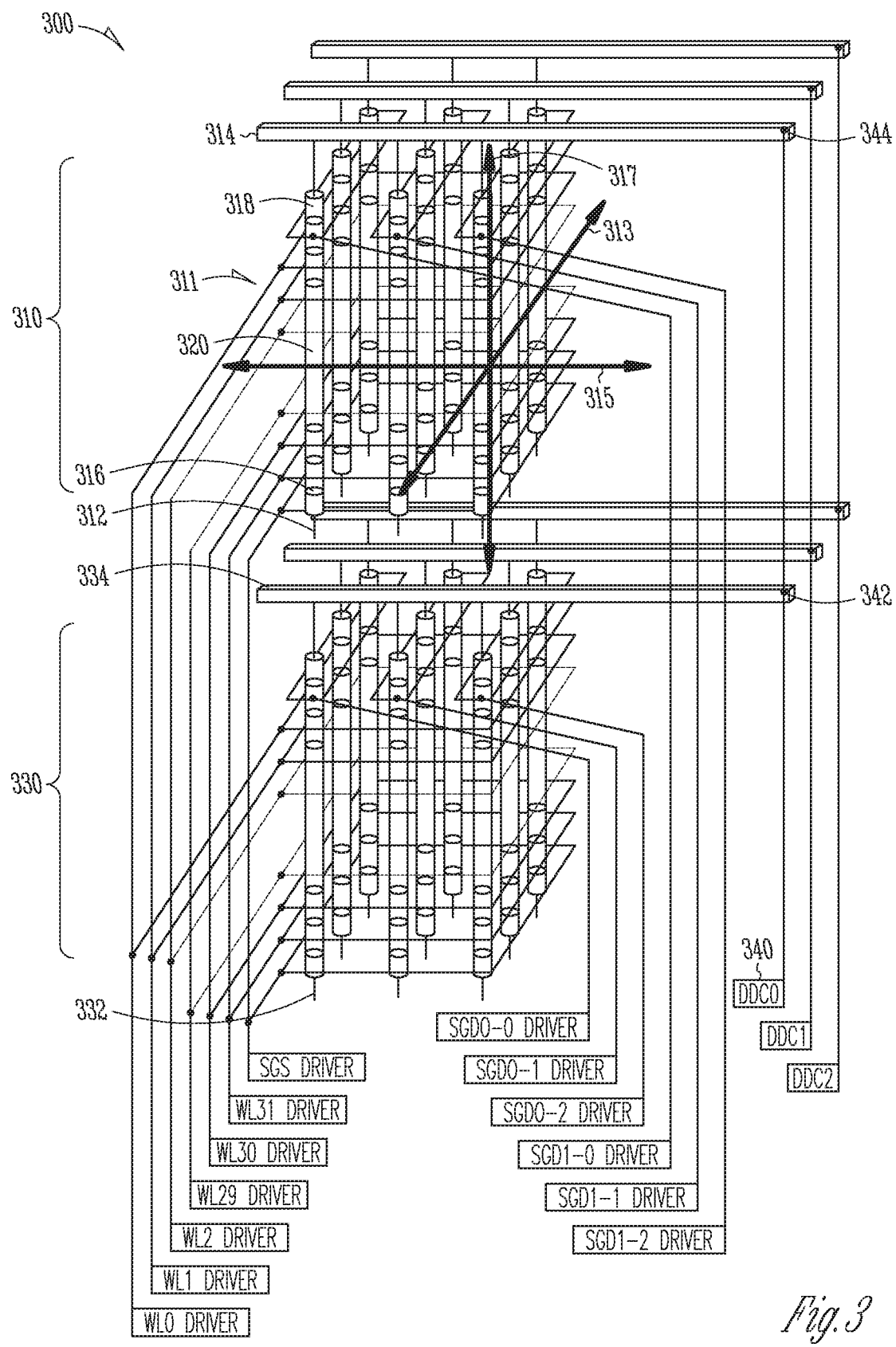
FIG. 3 shows an isometric block diagram of a memory device according to an embodiment of the invention.

FIG. 3 shows an apparatus 300 including a plurality of stacked arrays. For illustration purposes, two arrays are shown, including a first array 310 and a second array 330. Although two arrays are shown, other example configurations include three or more arrays in the plurality of stacked arrays. Stacking arrays such as arrays 310, 330 increases the density of memory per unit area on a semiconductor chip.

The first array 310 includes a number of memory cell strings 311, arranged in rows along axis 313 and columns along axis 315. In one example, the memory cell strings 311 include NAND memory cell strings. The example of FIG. 3 shows the memory cell strings 311 as substantially vertical memory cell strings oriented along vertical axis 317. Although substantially straight, substantially vertical memory cell strings 311 are used as an example, embodiments of the invention is not so limited. Other memory cell string configurations such as lateral, or U-shaped memory cell strings 311 may be used in accordance with some embodiments of the present invention.

The memory cell strings 311 are coupled between a source 312 and a data line 314. In the example of FIG. 3, a memory cell region 320 is located in the middle of the memory cell strings 311. A source select gate 316 is shown located between the memory cell region 320 and the source 312. In one example, a drain select gate 318 is located between the memory cell region 320 and the data line 314. The first array is shown with a first source 312, and a first data line 314, while the second array 330 is shown with a second source 332 and a second data line 334.

A data detector 340 is also shown in FIG. 3. In one example, the data detector 340 is a shared data detector. In FIG. 3, the data detector 340 is coupled to the second data line at node 342, and is further coupled to the first data line 314 at node 344. By using a shared data detector 340, chip area can be saved, and device density can be improved. In one example, the data detector is formed beneath the plurality of arrays in the apparatus 300. Forming the data detector beneath the plurality of arrays can further improve device density by reducing a number of circuits that are formed on a periphery of arrays 310, 330. Examples of stacked array apparatuses using shared circuitry such as shared data detector can enable increased scaling of stacked arrays 310, 330, etc. In particular, larger circuits, such as data detectors can be formed in reduced numbers while larger numbers of arrays are stacked.

Figure 4:
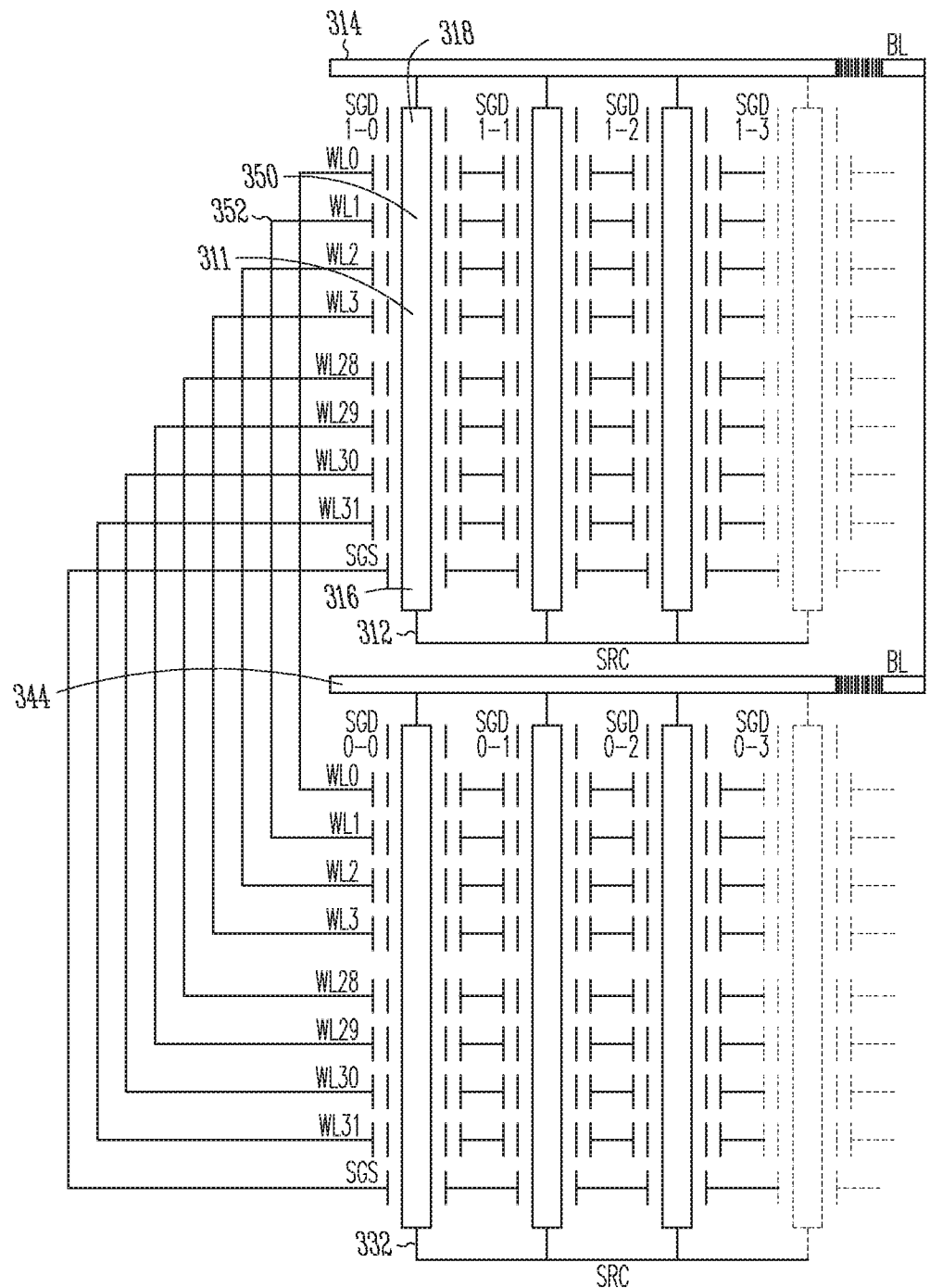
FIG. 4 shows a schematic diagram of the memory device from FIG. 3 according to an embodiment of the invention.

FIG. 4 shows a block diagram of portions of the apparatus 300 from FIG. 3. The source select gate 316 is again shown located between the memory cell region 320 and the source 312. In FIG. 4, the individual sources 312 are shown coupled together as a source line. The drain select gate 318 is again shown located between the memory cell region and the data line 314. A number of individual memory cells 350 are shown along the vertical axis of the memory cell string 311. A number of access lines 352 (e.g. wordlines) are shown to operate each of the individual memory cells 350 in the memory cell string 311. In one example, a shared driver is used to drive corresponding access lines in each of the arrays.

Figure 5:
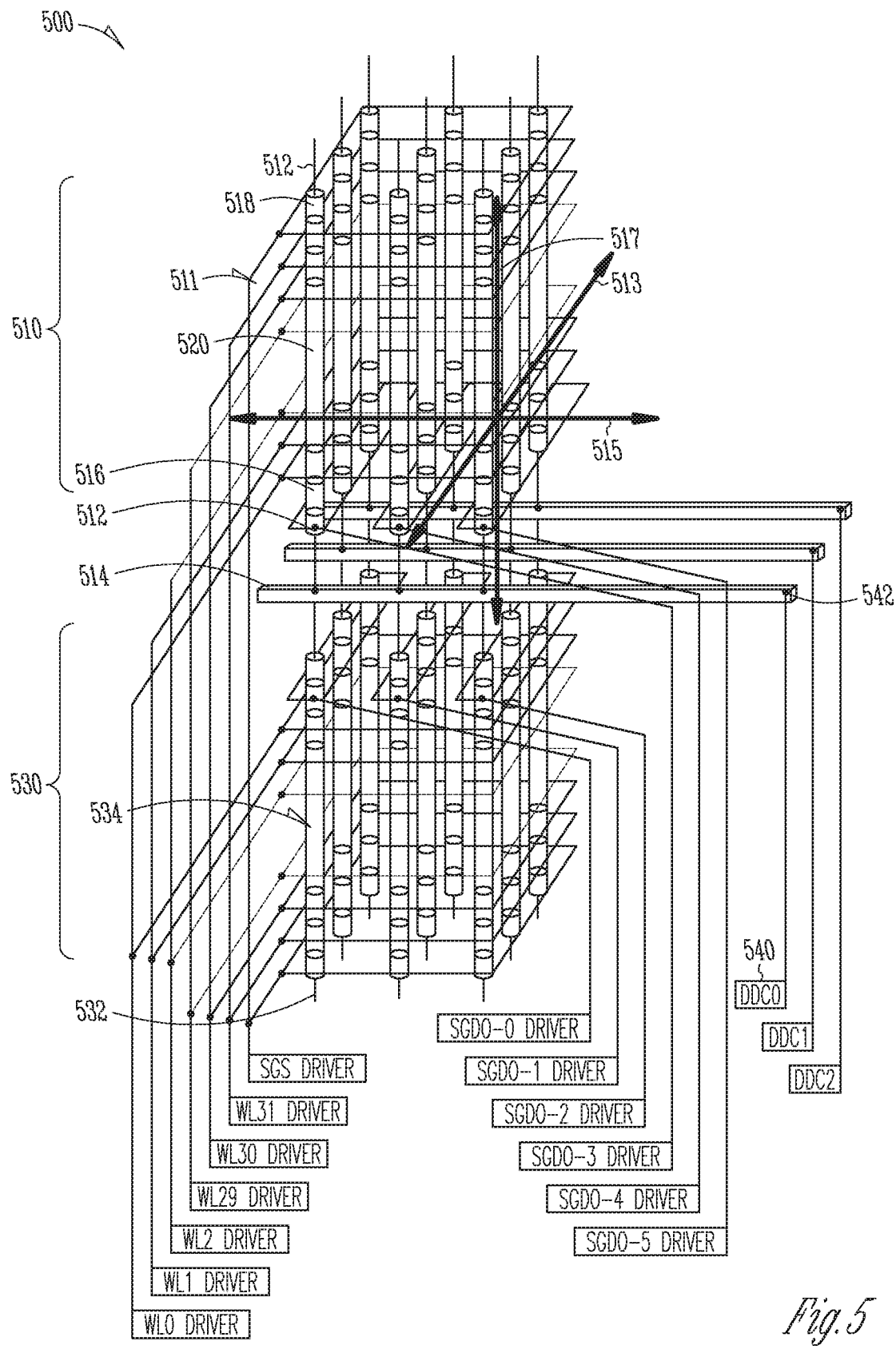
FIG. 5 shows an isometric block diagram of a memory device according to an embodiment of the invention.

FIG. 5 shows another example apparatus 500 including a plurality of stacked arrays. For illustration purposes, two arrays are shown, including a first array 510 and a second array 530. Although two arrays are shown, other example configurations include three or more arrays in the plurality of stacked arrays. In one example, the number of arrays in the plurality of stacked arrays is an even number of arrays as discussed below.

The first array 510 includes a number of memory cell strings 511, arranged in rows along axis 513 and columns along axis 515. In one example, the memory cell strings 511 include NAND memory cell strings. FIG. 5 shows the memory cell strings 511 as substantially vertical memory cell strings oriented along vertical axis 317, although other configurations such as lateral strings or U-shaped strings may also be used.

The memory cell strings 511 are coupled between a source 512 and a data line 314. In the example of FIG. 5, a memory cell region 520 is located in the middle of the memory cell strings 511. A source select gate 518 is shown located between the memory cell region 520 and the source 512. In one example, a drain select gate 516 is located between the memory cell region 520 and the data line 514.

In the example of FIG. 5, the data line 514 is a shared data line 514. FIG. 5 illustrates memory cell strings 534 in the second array 530 coupled between a source 532 and the shared data line 514.

A data detector 540 is also shown in FIG. 5. In one example, the data detector 540 is a shared data detector (e.g., in this case, shared between the arrays 510 and 530). The data detector 540 is coupled to the shared data line 514 at node 542. In the example of FIG. 5, two arrays 510, 530 are shown in the apparatus 500. In other example embodiments, additional arrays are included and further stacked vertically along axis 517. In one example, additional arrays are included in pairs, with each pair of arrays sharing one or more data lines similar to the first array 510 and the second array 530. In one example, using paired arrays, the number of arrays in the plurality of stacked arrays is an even number. In one example, the pairs of the arrays coupled back to back.

In one example an array is inverted with respect to a paired array to facilitate sharing of a data line. In FIG. 5, the first array 510 is inverted with respect to the second array 530. The source 512 of the first array 510 is on the top of the first array 510, and the source 532 of the second array 530 is on the bottom of the second array 530. In operation current may conduct from the respective sources 512, 532 to the shared data line 514, and be detected at the data detector 540.

Figure 6:
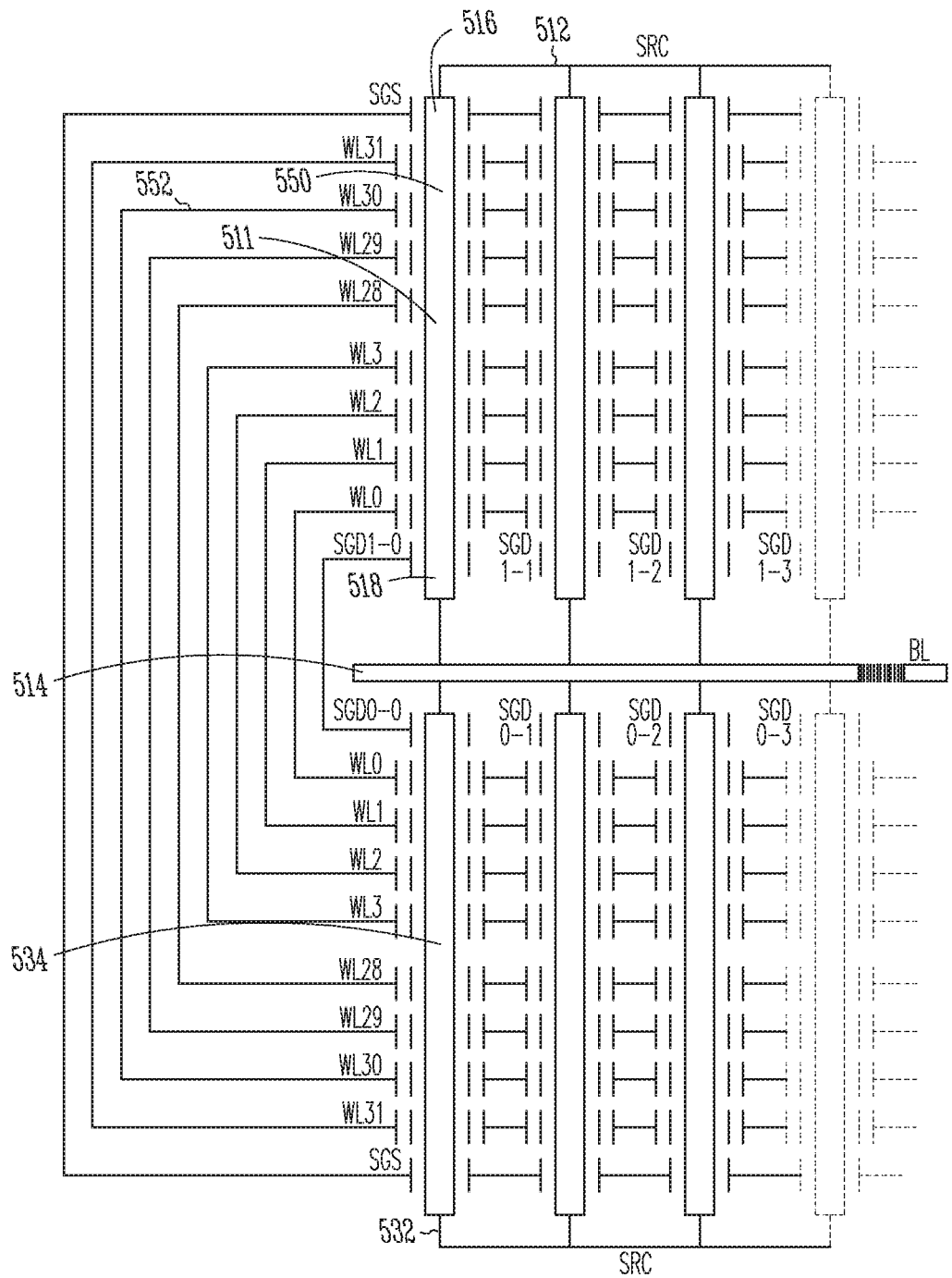
FIG. 6 shows a schematic diagram of the memory device from FIG. 5 according to an embodiment of the invention.

FIG. 6 shows a block diagram of portions of the apparatus 500 from FIG. 5. The source select gate 516 is again shown located between the memory cell region 520 and the source 512. The drain select gate 518 is again shown located between the memory cell region 520 and the data line 514. A number of individual memory cells 550 are shown along the vertical axis 517 of the memory cell string 511. A number of access lines 552 (e.g. wordlines) are shown to operate each of the individual memory cells 550 in the memory cell string 511. In one example, a shared driver is used to drive corresponding access lines in each of the arrays.

Figure 7:
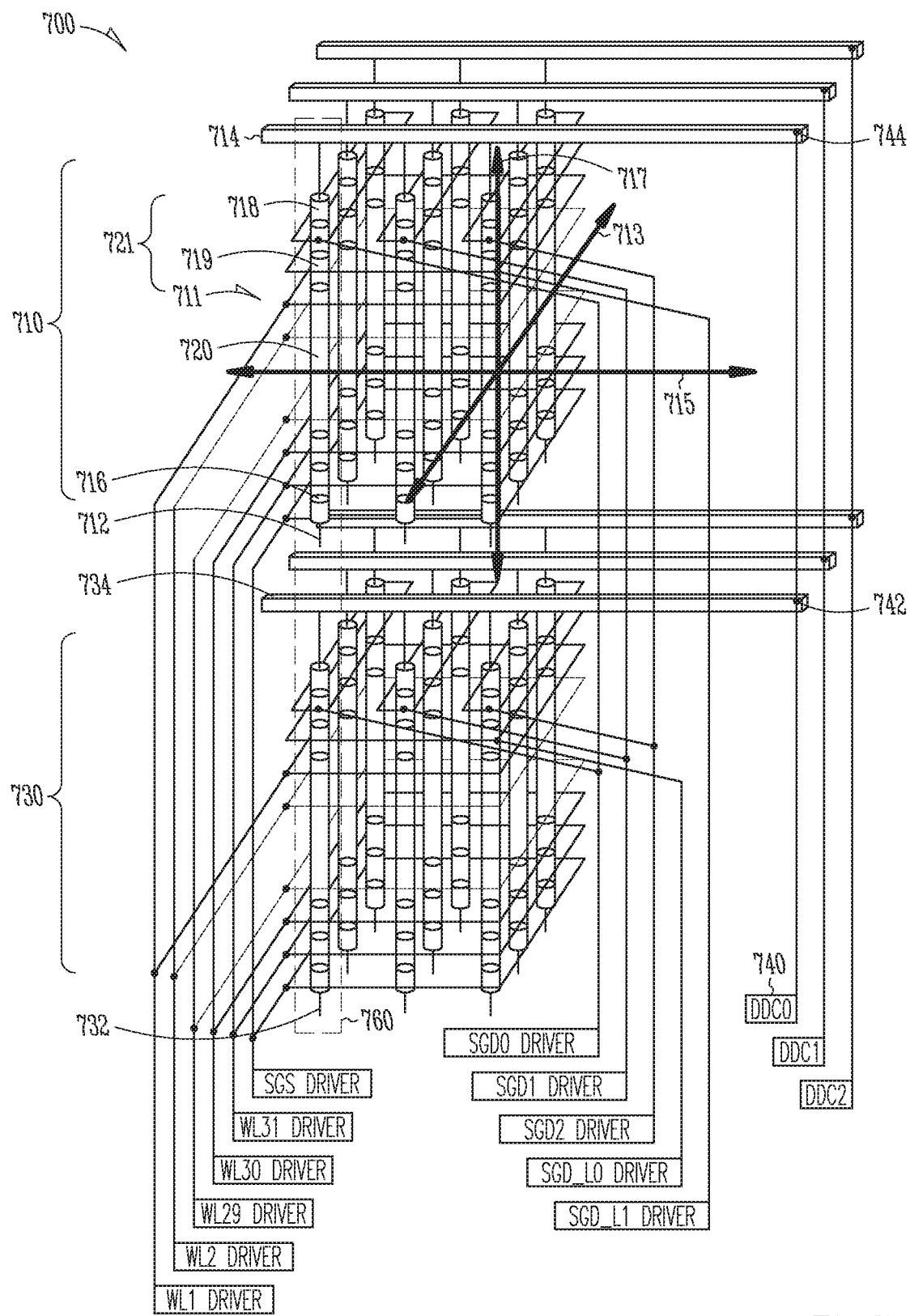
FIG. 7 shows an isometric block diagram of a memory device according to an embodiment of the invention.

FIG. 7 shows an apparatus 700 including a plurality of stacked arrays, including a first array 710 and a second array 730. Although two arrays are shown, other example configurations include three or more arrays in the plurality of stacked arrays.

The first array 710 includes a number of memory cell strings 711, arranged in rows along axis 713 and columns along axis 715. In one example, the memory cell strings 711 include NAND memory cell strings. The example of FIG. 7 shows the memory cell strings 711 as substantially vertical memory cell strings oriented along vertical axis 717. Although substantially straight, substantially vertical memory cell strings 711 are used as an example, other configurations such as lateral, or U-shapes memory cell strings 711 may be used in accordance with embodiments of the present invention.

The memory cell strings 711 of the first array 710 are coupled between a source 712 and a first data line 714. In the example of FIG. 7, a memory cell region 720 is located in a middle of the memory cell strings 711. A source select gate 716 is shown located between the memory cell region 720 and the source 712.

FIG. 7 includes a plurality of hierarchical select gates 721 coupled between the memory regions 720 and the data lines 714. In one example, the plurality of hierarchical select gates include a first select gate 718 and a second select gate 719. In one example, a hierarchical select gate configuration operates using a first select gate to select a number (referred to hereinafter as a "block") of memory cell strings across more than one array in the plurality of stacked arrays. The hierarchical select gate configuration then operates using a second select gate to select a number of memory cell strings from within the block selected by the first select gate (e.g., the strings of the selected block within a selected one of stacked arrays 710 and 730).

Configurations using a hierarchical select gate configuration can reduce an amount of memory cell string selection circuitry (for example selection circuitry 140 from FIG. 1) and further increase device density on a given semiconductor surface.

The first array 710 is shown with a first source 712, and a first data line 714, while the second array 720 is shown with a second source 732 and a second data line 734. A data detector 740 is also shown in FIG. 7. In one example, the data detector 740 is a shared data detector. In FIG. 7, the data detector 740 is coupled to the second data line 734 at node 742, and is further coupled to the first data line 714 at node 744. By using a shared data detector 740, chip area can be saved, and device density can be improved. In one example, the data detector is formed beneath the plurality of arrays in the apparatus 700.

Figure 8:
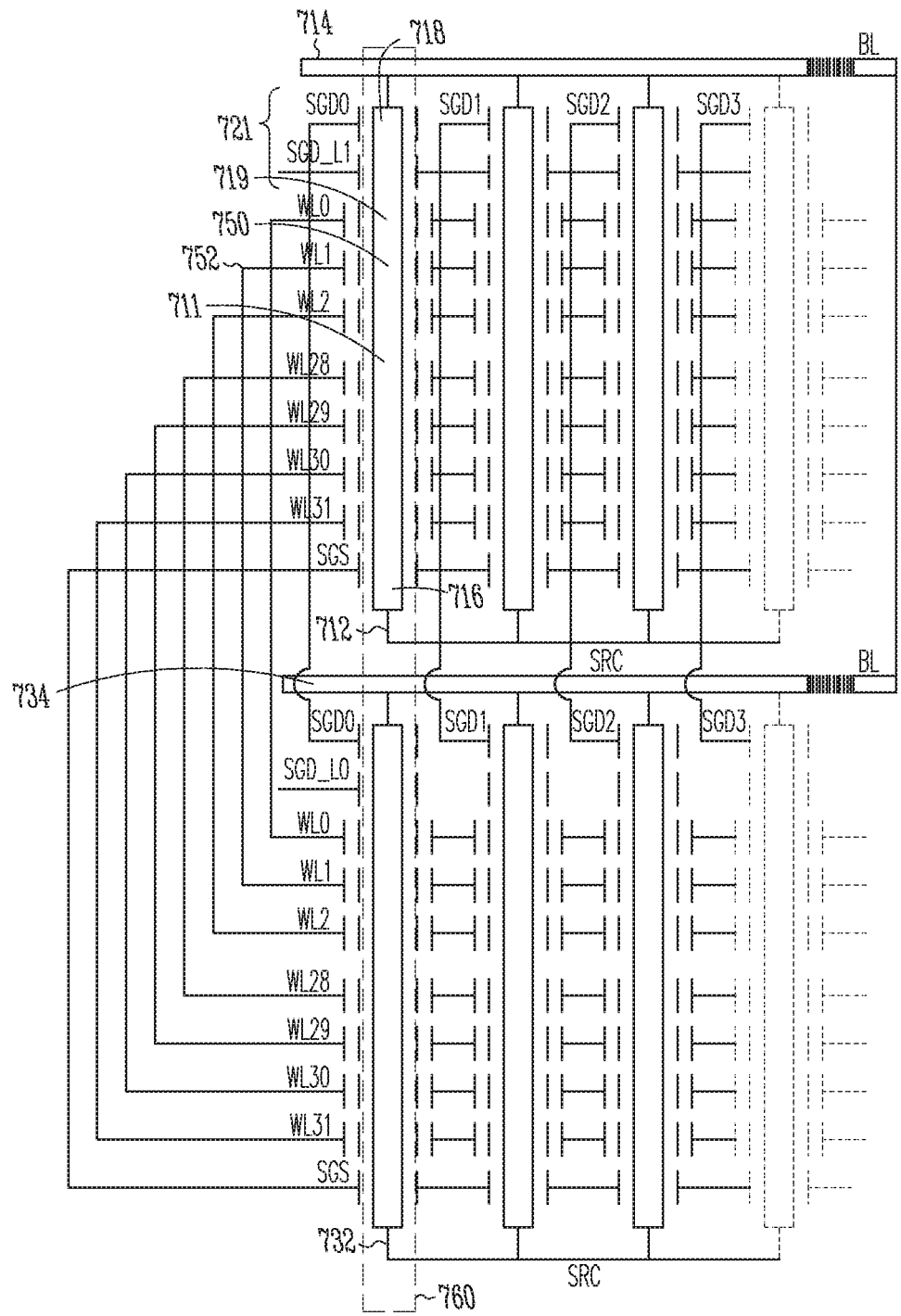
FIG. 8 shows a schematic diagram of the memory device from FIG. 7 according to an embodiment of the invention.

FIG. 8 shows a block diagram of portions of the apparatus 700 from FIG. 7. The source select gate 716 is again shown located between the memory cell region 720 and the source 712. The hierarchical select gates 721 are shown coupled between the memory regions 720 and the data lines 714. The hierarchical select gates 721 show the first select gate 718 to select a row of blocks. The hierarchical select gates 721 further show the second select gate 719 to select an array level within a selected one of stacked arrays 710 and 730 that are within the selected block 760 of memory cell strings.

As in other example configurations shown, a number of individual memory cells 750 are shown along the vertical axis 717 of the memory cell string 711. A number of access lines 752 (e.g. wordlines) are shown to operate each of the individual memory cells 750 in the memory cell string 711.

Figure 9:
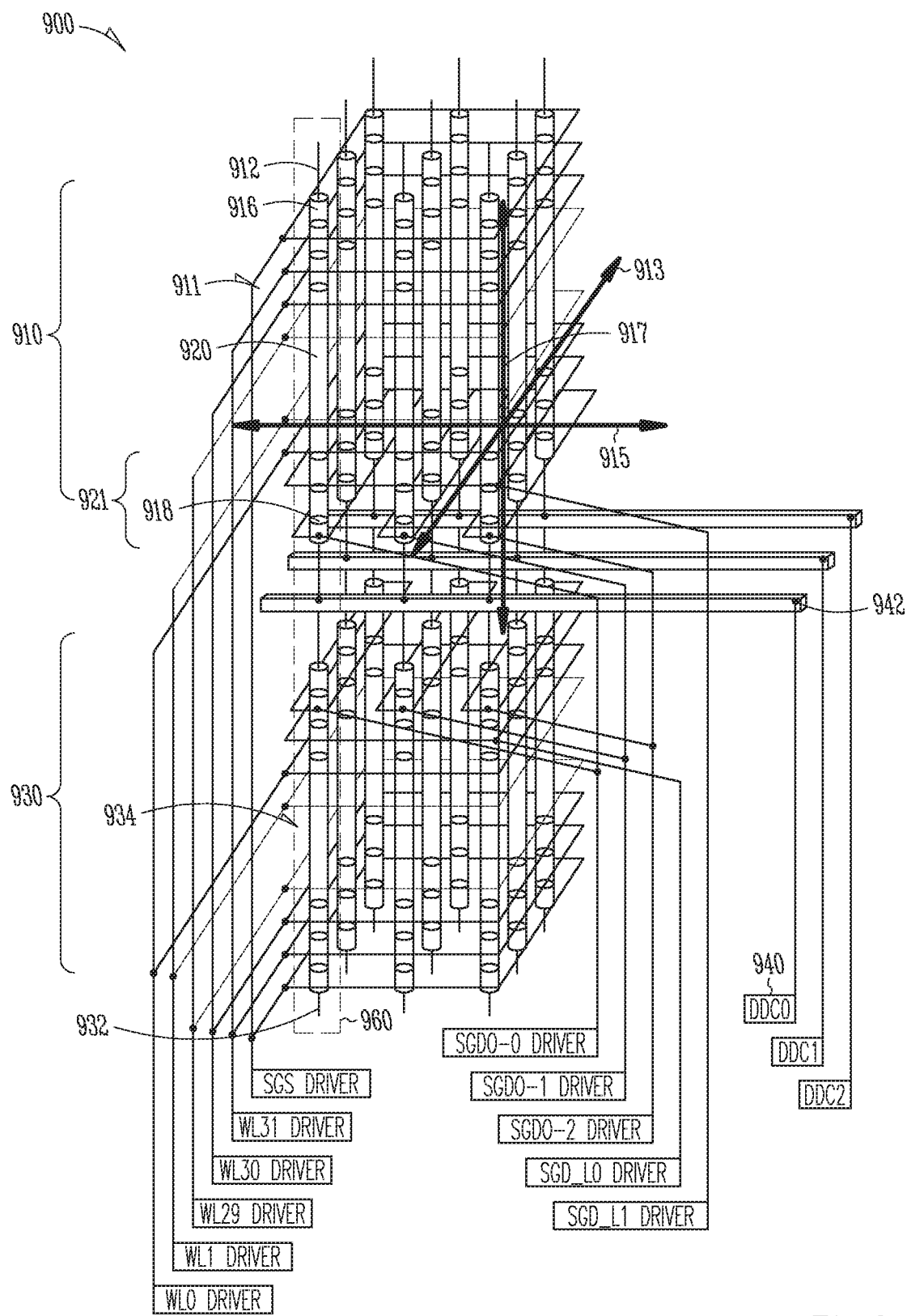
FIG. 9 shows an isometric block diagram of a memory device according to an embodiment of the invention.

FIG. 9 shows another example apparatus 900 including a plurality of stacked arrays. For illustration purposes, two arrays are shown, including a first array 910 and a second array 930. Although two arrays are shown, other example configurations include three or more arrays in the plurality of stacked arrays. In one example, the number of arrays in the plurality of stacked arrays is an even number of arrays as discussed below.

The first array 910 includes a number of memory cell strings 911, arranged in rows along axis 913 and columns along axis 915. In one example, the memory cell strings 911 include NAND memory cell strings. FIG. 9 shows the memory cell strings 911 as vertical memory cell strings oriented along vertical axis 917, although other configurations such as lateral strings or U-shaped strings may also be used.

The memory cell strings 911 are coupled between a source 912 and a data line 914. In the example of FIG. 9, a memory cell region 920 is located in a middle of the memory cell strings 911. A source select gate 916 is shown located between the memory cell region 920 and the source 912. In the example of FIG. 9, the data line 914 is a shared data line 914. FIG. 9 illustrates memory cell strings 934 in the second array 930 coupled between a source 932 and the shared data line 914.

FIG. 9 further includes a plurality of hierarchical select gates 921 coupled between the memory cell regions 920 and the shared data line 914. In one example, the plurality of hierarchical select gates include a first select gate 918 and a second select gate 919. In one example, a hierarchical select gate configuration operates using a first select gate to select a row of blocks 960 of memory cell strings across more than one array in the plurality of stacked arrays. The hierarchical select gate configuration then operates using a second select gate to select an array level of cell strings from within the selected row of blocks of memory cell strings selected by the first select gate.

A data detector 940 is also shown in FIG. 9. In one example, the data detector 940 is a shared data detector. The data detector 940 is coupled to the shared data line 914 at node 942. In the example of FIG. 9, two arrays 910, 930 are shown in the apparatus 900. In other example embodiments, additional arrays are included and further stacked vertically along axis 917. In one example, additional arrays are included in pairs, with each pair of arrays sharing one or more data lines similar to the first array 910 and the second array 930. In one example, using paired arrays, the number of arrays in the plurality of stacked arrays is an even number.

In one example an array is inverted with respect to a paired array to facilitate sharing of a data line. In FIG. 9, the first array 910 is inverted with respect to the second array 930. The source 912 of the first array 910 is on the top of the first array 910, and the source 932 of the second array 930 is on the bottom of the second array 930. In operation current may conduct from the respective sources 912, 932 to the shared data line 914, and be detected at the data detector 940.

Figure 10:
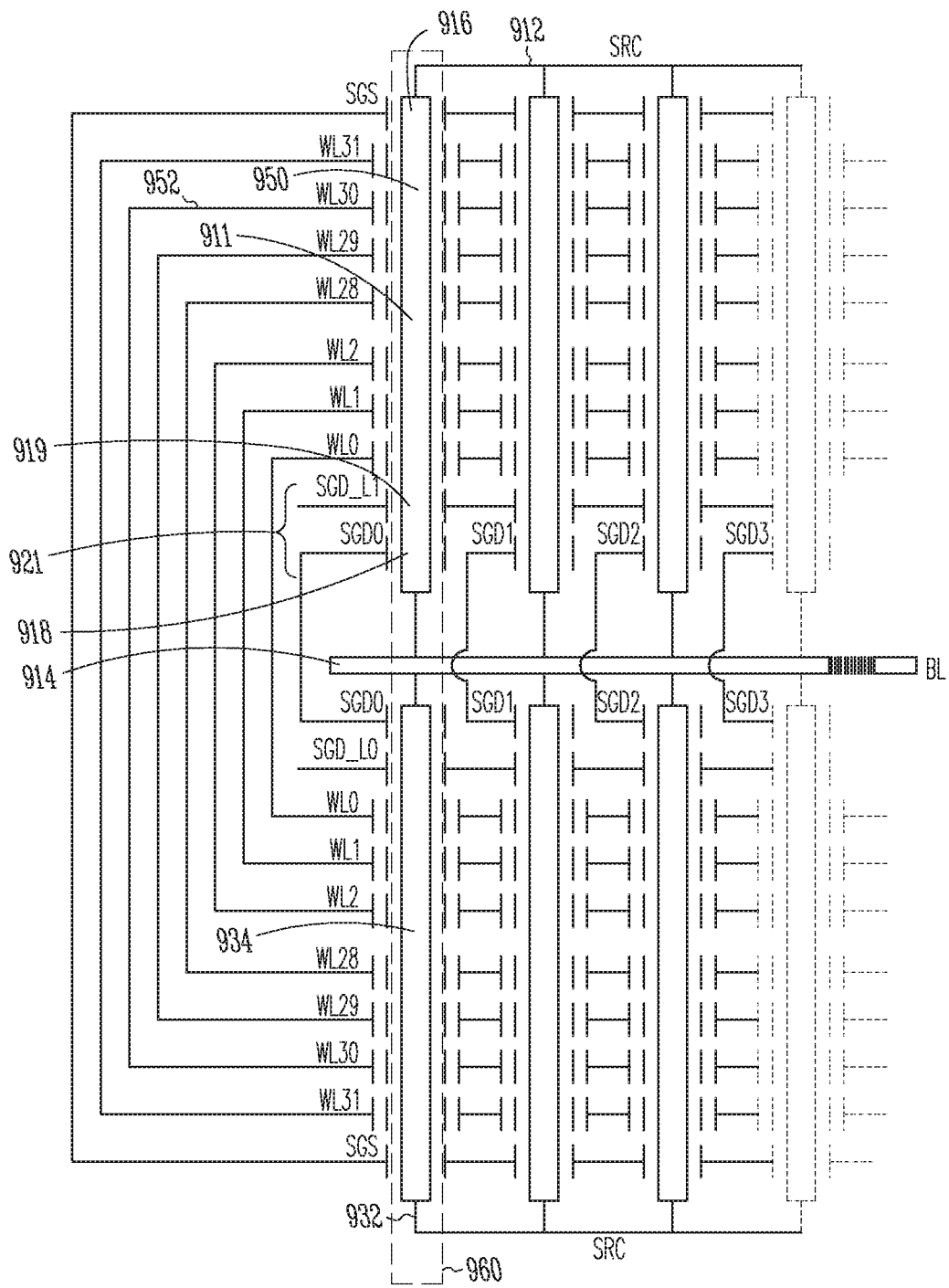
FIG. 10 shows a schematic diagram of the memory device from FIG. 9 according to an embodiment of the invention.

FIG. 10 shows a block diagram of portions of the apparatus 900 from FIG. 9. The source select gate 916 is again shown located between the memory cell region 920 and the source 912. The hierarchical select gates 921 are shown coupled between the memory cell regions 920 and the shared data line 914. The hierarchical select gates 921 show the first select gate 918 to select a row of blocks 960 of memory cell strings. The hierarchical select gates 921 further show the second select gate 919 to select an array level of cell strings within a selected one of stacked arrays 910 and 930 that are within the selected row of blocks 960.

As in other example configurations shown, a number of individual memory cells 950 are shown along the vertical axis 917 of the memory cell string 911. A number of access lines 952 (e.g. wordlines) are shown to operate each of the individual memory cells 950 in the memory cell string 911.

Figure 11:
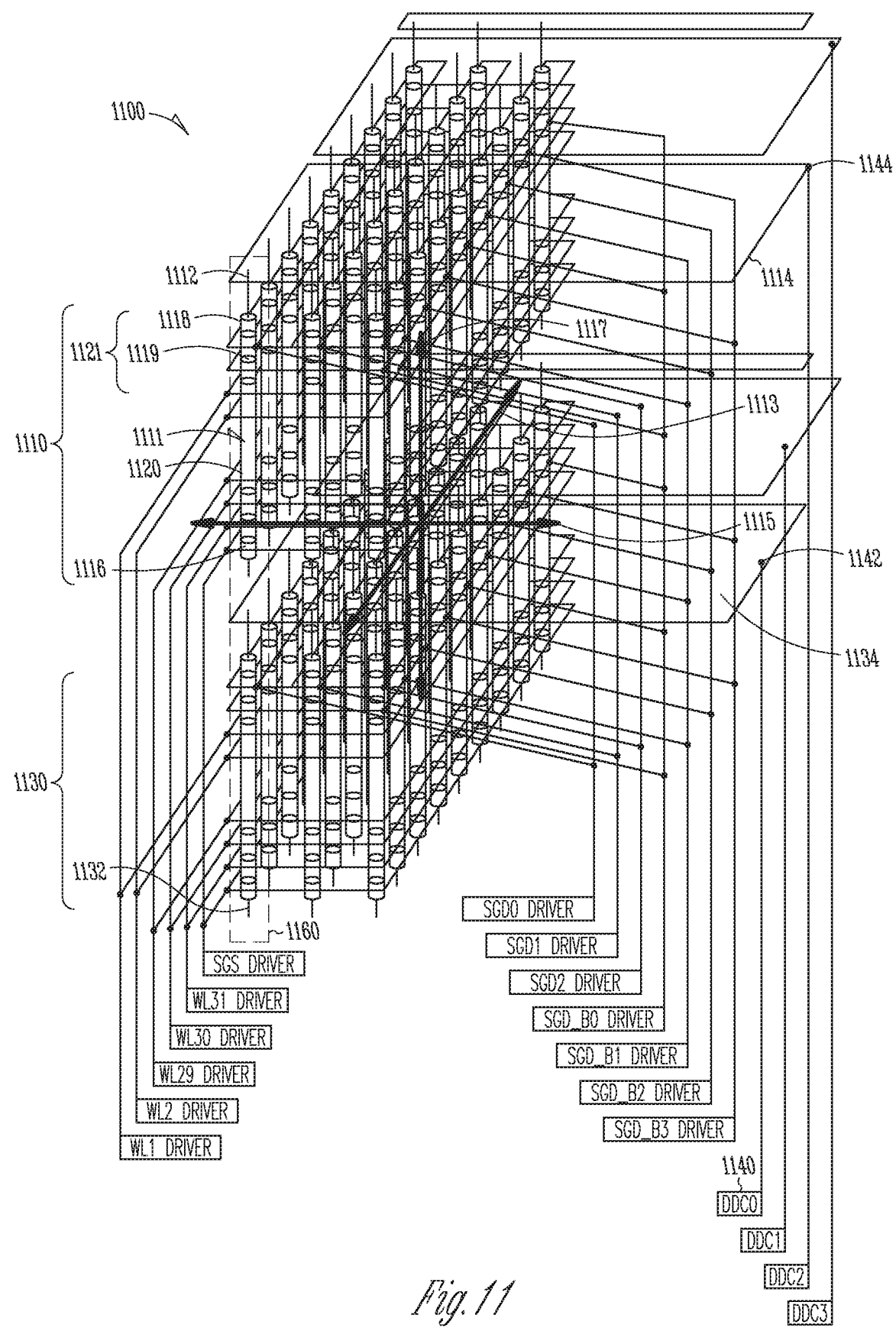
FIG. 11 shows an isometric block diagram of a memory device according to an embodiment of the invention.

FIG. 11 shows an apparatus 1100 including a plurality of stacked arrays, including a first array 1110 and a second array 1130. Although two arrays are shown, other example configurations include three or more arrays in the plurality of stacked arrays.

The first array 1110 includes a number of memory cell strings 1111, arranged in rows along axis 1113 and columns along axis 1115. In one example, the memory cell strings 1111 include NAND memory cell strings. The example of FIG. 11 shows the memory cell strings 1111 as substantially vertical memory cell strings oriented along vertical axis 1117. Although substantially straight, substantially vertical memory cell strings 1111 are used as an example, other configurations such as lateral, or U-shapes memory cell strings 1111 may be used in accordance with embodiments of the present invention.

The memory cell strings 1111 of the first array 1110 are coupled between a source 1112 and a first data plate 1114. In one example, the first data plate 1114 is coupled to multiple memory cell strings 1111 in both the row axis 1113 and the column axis 1115 as shown in the Figure. In one example, the first data plate 1114 is coupled to four columns in the row axis 1113, and complete rows in the column axis 1115, as shown in similar examples above.

In the example of FIG. 11, a memory cell region 1120 is located in a middle of the memory cell strings 1111. A source select gate 1116 is shown located between the memory cell region 1120 and the source 1112.

FIG. 11 includes a plurality of select gates 1121 coupled between the memory cell regions 1120 and the data plate 1114. In one example, the plurality of select gates include a first select gate 1118 and a second select gate 1119. In one example, the select gate configuration operates using a first select gate to select a row of blocks 1160. The select gate configuration then operates using a second select gate to select a column of blocks 1160 front within the blocks of memory cell strings selected by the first select gate.

Configurations using such a select gate configuration can reduce an amount of memory cell string selection circuitry, and further increase device density on a given semiconductor surface.

The first array 1110 is shown with a first source 1112, and a first data plate 1114, while the second array 1130 is shown with a second source 1132 and a second data plate 1134. A data detector 1140 is also shown in FIG. 11. In FIG. 11, the data detector DDC0 1140 is coupled to the second data plate 1134 at node 1142. By using the data plates and the illustrated select gate configuration, chip area can be saved, and device density can be improved. In one example, the data detectors are formed beneath the plurality of arrays in the apparatus 1100. By using data plates 1114, 1134, more memory cell strings 1111 are coupled to a single data detector 1140, and chip area may be further saved.

Figure 12:
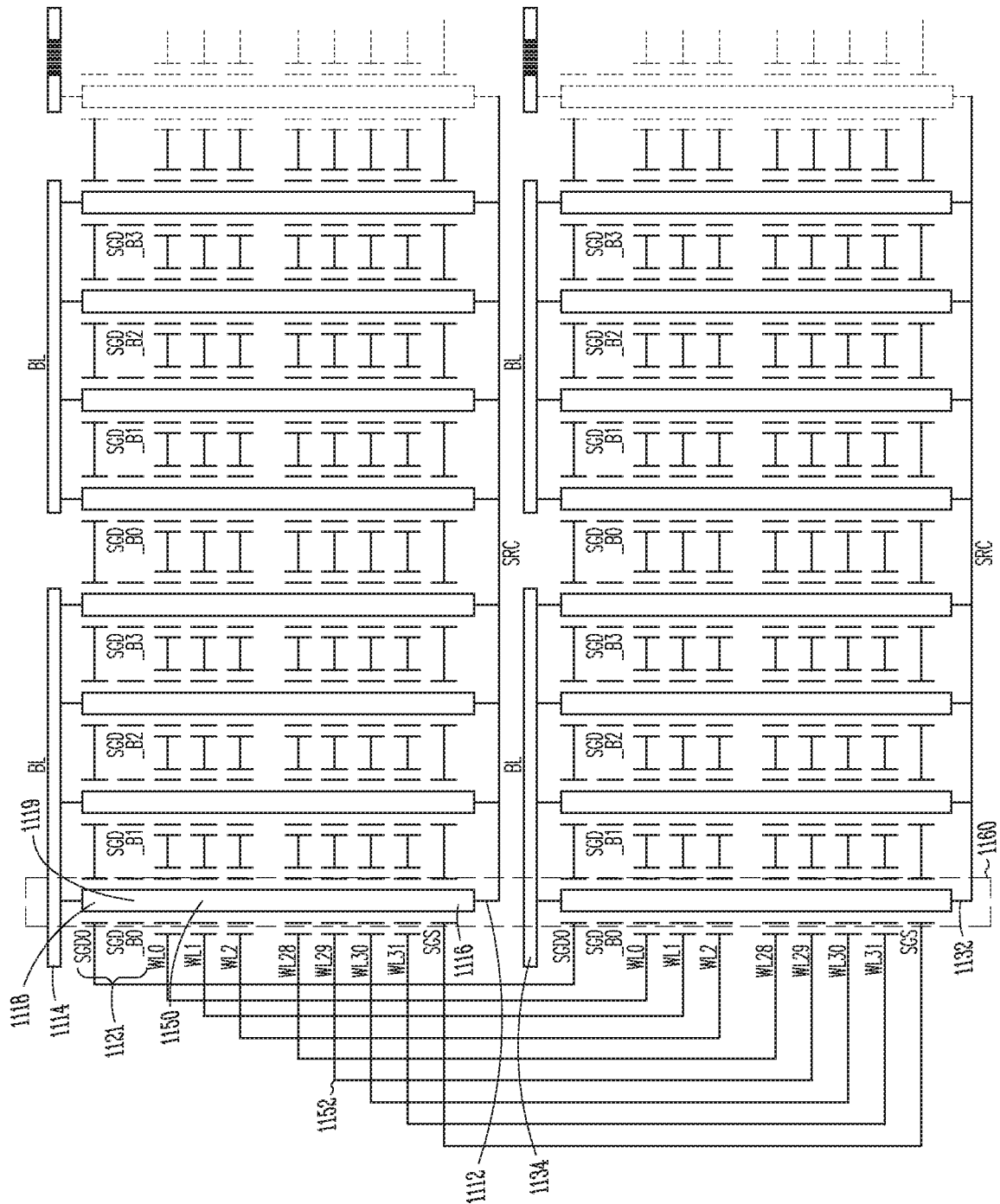
FIG. 12 shows a schematic diagram of the memory device from FIG. 11 according to an embodiment of the invention.

FIG. 12 shows a block diagram of portions of the apparatus 1100 from FIG. 11. The source select gate 1116 is again shown located between the memory cell region 1120 and the source 1112. The select gates 1121 are shown coupled between the memory cell regions 1120 and the data plate 1114. The select gates 1121 show the first select gate 1118 to select a row of blocks 1160. The select gates 1121 further show the second select gate 1119 to select a column of blocks 1160.

As in other example configurations shown, a number of individual memory cells 1150 are shown along the vertical axis 1117 of the memory cell string 1111. A number of access lines 1152 (e.g. wordlines) are shown to operate each of the individual memory cells 1150 in the memory cell string 1111.

Figure 13:
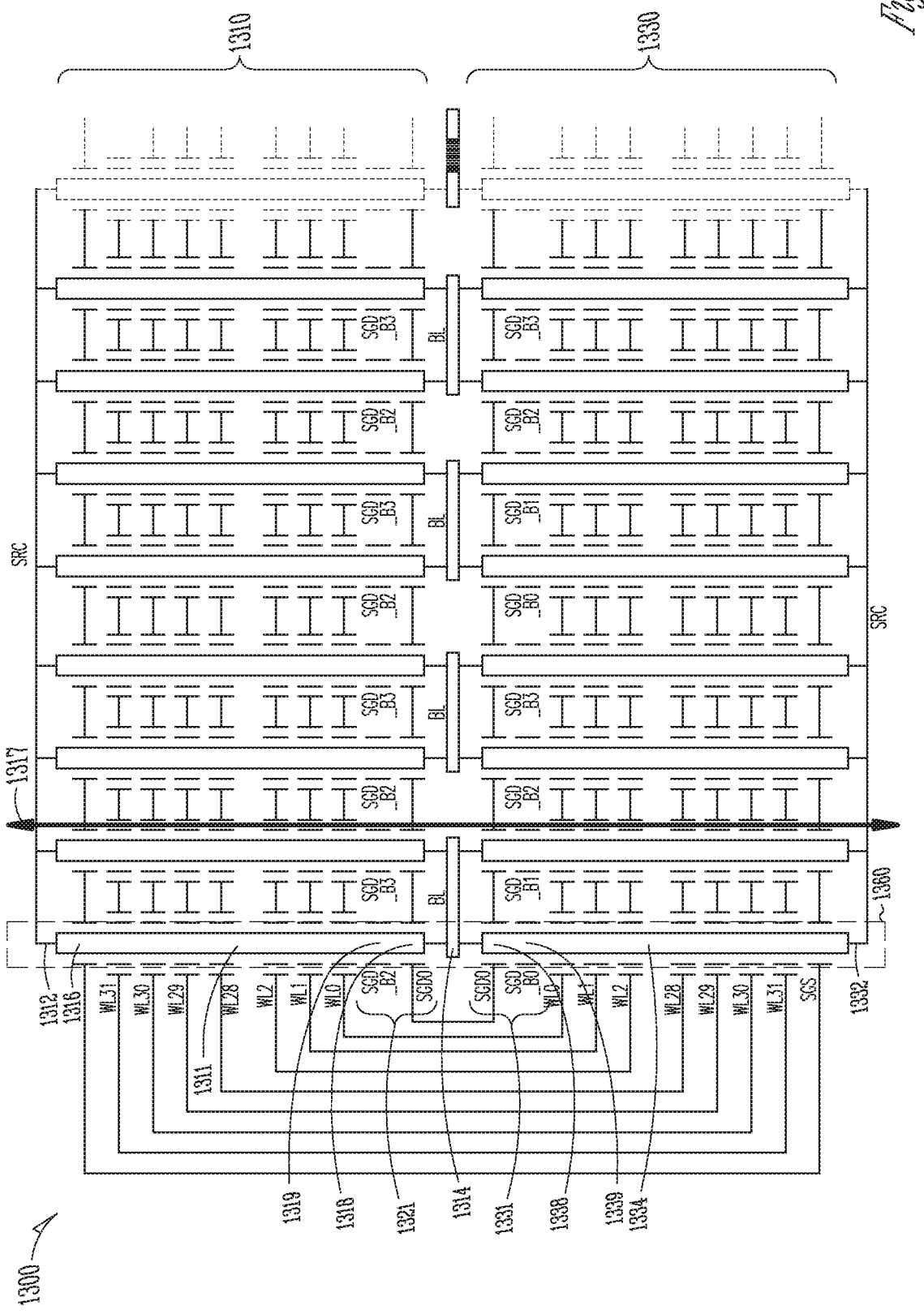
FIG. 13 shows a schematic diagram of a memory device according to an embodiment of the invention.

FIG. 13 shows a block diagram of portions of an apparatus 1300 including a plurality of stacked arrays, including a first array 1310 and a second array 1330. A source select gate 1316 is shown located between a memory cell region 1320 and a source 1312. Select gates 1321 are shown coupled between the memory cell regions in the first array 1310, and a data plate 1314. In the example configuration of FIG. 13, the data plate 1314 is a shared data plate. Select gates 1331 are further shown coupled between the memory cell regions 1320 in the second array 1330, and the shared data plate 1314. In one example, the shared data plate 1314 is shared between two columns in the first array 1310 and two columns in the second array 1330 for a total of four columns. Other configurations of shared data plates may couple to other numbers of columns in the first and second arrays 1310, 1330.

The select gates 1321 show a first select gate 1318 in the first array 1310 and a first select gate 1338 in the second array 1330 coupled together and used to select a row of blocks 1360. The select gates 1121 further show second select gates 1319 in the first array 1310 and second select gates 1339 in the second array 1330 to select a column of blocks 1360.

In the example of FIG. 13, two arrays 1310, 1330 are shown in the apparatus 1300. In other example embodiments, additional arrays are included and further stacked vertically along axis 1317. In one example, additional arrays are included in pairs, with each pair of arrays sharing one or more data plates 1314 similar to the first array 1310 and the second array 1330. In one example, using paired arrays, the number of arrays in the plurality of stacked arrays is an even number.

In one example an array is inverted with respect to a paired array to facilitate sharing of a data plate. In FIG. 13, the first array 1310 is inverted with respect to the second array 1330. The source 1312 of the first array 1310 is on the top of the first array 1310, and a source 1332 of the second array 1330 is on the bottom of the second array 1330. In operation current is conducted from the respective sources 1312, 1332 to the shared data plate 1314, and be detected at an attached data detector (not shown).

Figure 14:
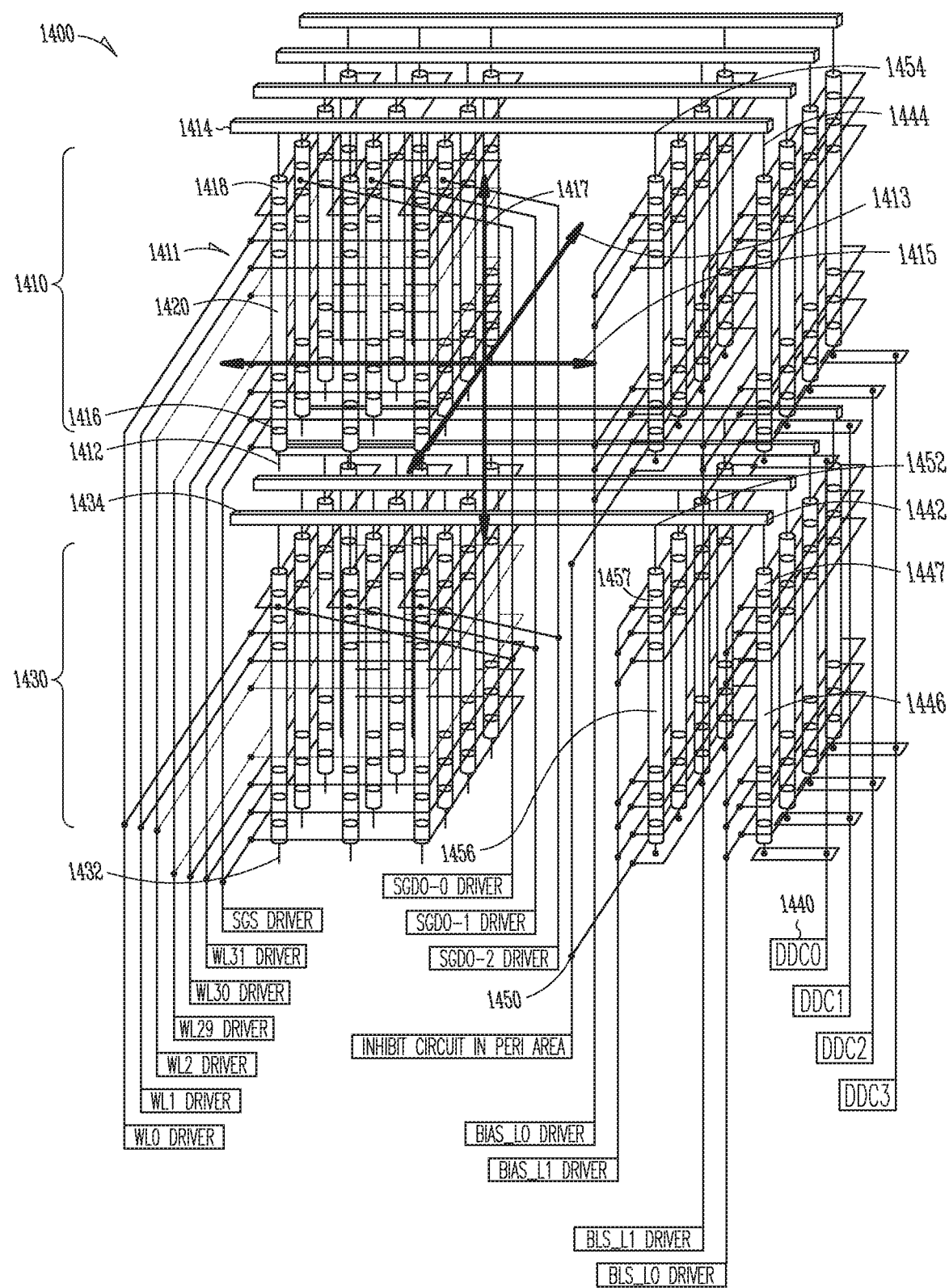
FIG. 14 shows an isometric block diagram of memory device according to an embodiment of the invention.

FIG. 14 shows an apparatus 1400 including a plurality of stacked arrays. For illustration purposes, two arrays are shown, including a first array 1410 and a second array 1430. Although two arrays are shown, other example configurations include three or more arrays in the plurality of stacked arrays. Stacking arrays such as arrays 1410, 1430 increases a density of memory per unit area on a semiconductor chip.

The first array 1410 includes a number of memory cell strings 1411, arranged in rows along axis 1413 and columns along axis 1415. In one example, the memory cell strings 1411 include NAND memory cell strings. The example of FIG. 14 shows the memory cell strings 1411 as substantially vertical memory cell strings oriented along vertical axis 1417. Although substantially straight, substantially vertical memory cell strings 1411 are used as an example, other memory cell string configurations such as lateral, or U-shapes memory cell strings 1411 may be used in accordance with embodiments of the present invention.

The memory cell strings 1411 are coupled between a source 1412 and a data line 1414. In the example of FIG. 14, a memory cell region 1420 is located in a middle of the memory cell strings 1411. A source select gate 1416 is shown located between the memory cell region 1420 and the source 1412. In one example, a drain select gate 1418 is located between the memory cell region 1420 and the data line 1414. The first array is shown with a first source 1412, and a first data line 1414, while the second array 1430 is shown with a second source 1432 and a second data line 1434.

A data detector 1440 is also shown in FIG. 14. In one example, the data detector 1440 is a shared data detector. In FIG. 14, the data detector 1440 is selectably coupled to the second data line 1434 at node 1442 through a switch such as example switch 1446, and is further selectably coupled to the first data line 1414 at node 1444 through a switch such as example switch 1466. By using a shared data detector 1440, chip area can be saved, and device density can be improved.

An inhibit voltage source 1450 is also shown in FIG. 14. In one example, the inhibit voltage source 1450 is a shared inhibit voltage source 1450. In FIG. 14, the inhibit voltage source 1450 is selectably coupled to the second data line 1434 at node 1452 through switch 1456, and is further selectably coupled to the first data line 1414 at node 1454 through a switch such as example switch 1468. By using a shared inhibit voltage source 1450, chip area can be saved, and device density can be improved. By selective coupling the data detector 1440 and the inhibit voltage source 1450, a string in one array within the plurality of stacked arrays can be inhibited while a string in another array within the plurality of stacked arrays is utilizing the data detector 1440.

Examples including an inhibit voltage source 1450 may use the inhibit voltage source 1450 to reduce unwanted disturbing of a data state in memory cells within memory cell strings. For example a reverse bias within the memory cell region 1420 inhibits unwanted charge migration from floating gates within the memory cell region 1420.

In one example the data detector 1440 is selectably coupled to the data line 1434 through switch 1446. The use of switches 1446 provides efficiency in manufacturing because similar structures are already being manufactured within the arrays 1410, 1430 to form memory cell strings. Switch 1446 includes at least one select gate 1447, similar to other select gates 1418 already being formed within the arrays 1410, 1430. The select gate 1447 provides selective coupling of the data detector 1440 to the data line 1434.

As with the data detector 1440, in one example, the inhibit voltage source 1450 is coupled to the data line 1434 through switch 1456. The use of switches 1456 provides efficiency in manufacturing because similar structures are already being manufactured within the arrays 1410, 1430 to form memory cell strings. Switch 1456 includes at least one select gate 1457 that provides selective coupling of the inhibit voltage source 1450 to the data line 1434.

Figure 15:
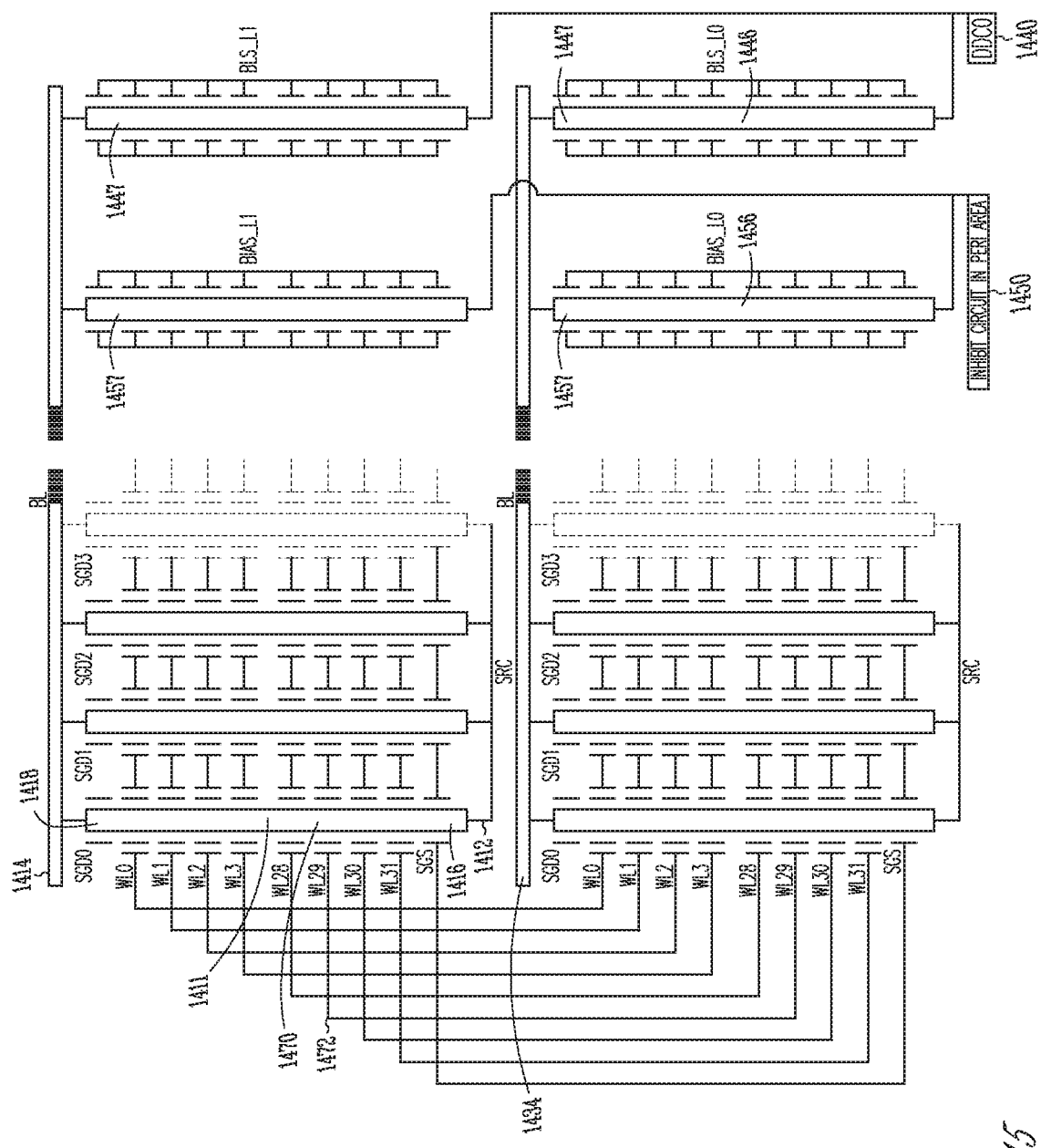
FIG. 15 shows a schematic diagram of the memory device from FIG. 14 according to an embodiment of the invention.

FIG. 15 shows a block diagram of portions of the apparatus 1400 from FIG. 14. The source select gate 1416 is again shown located between the memory cell region and the source 1412. The drain select gate 1418 is again shown located between the memory cell region and the data line 1414. A number of individual memory cells 1470 are shown along the vertical axis of the memory cell string 1411. A number of access lines 1472 (e.g. wordlines) are shown to operate each of the individual memory cells 1470 in the memory cell string 1411.

The inhibit voltage source 1450 and the data detector 1440 are further shown in FIG. 15, selectably coupled to the data line 1434 by respective switches 1456, 1446. By appropriate selection, using select gates 1457 and 1447, memory cell strings within a selected block within the plurality of stacked arrays can be either inhibited from electrical disturbance, or coupled to data detector 1440 to have their data state read.

Figure 16:
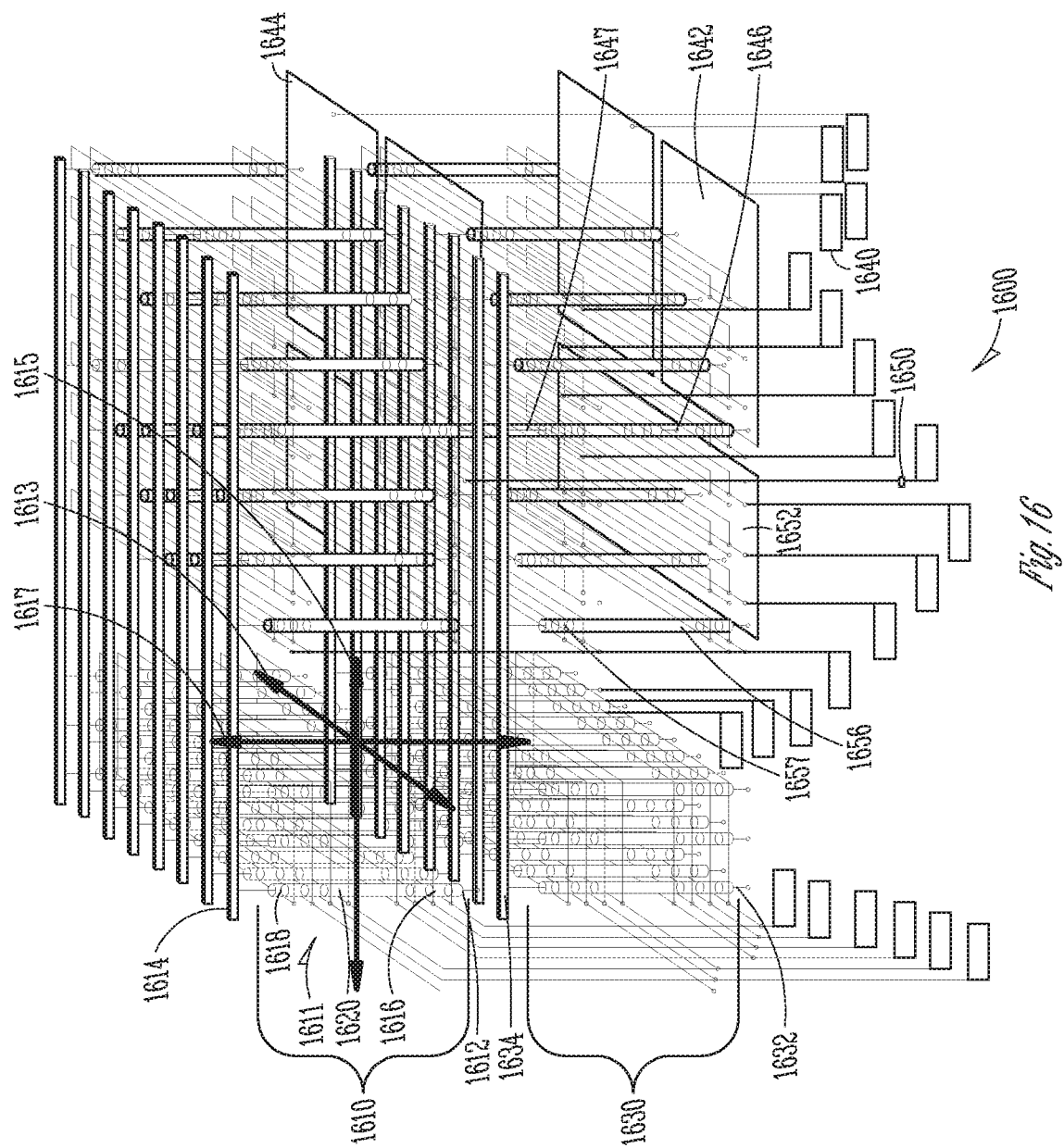
FIG. 16 shows an isometric block diagram of a memory device according to an embodiment of the invention.

FIG. 16 shows an apparatus 1600 including a plurality of stacked arrays. For illustration purposes, two arrays are shown, including a first array 1610 and a second array 1630. Although two arrays are shown, other example configurations include three or more arrays in the plurality of stacked arrays. Stacking arrays such as arrays 1610, 1630 increases a density of memory per unit area on a semiconductor chip.

The first array 1610 includes a number of memory cell strings 1611, arranged in rows along axis 1613 and columns along axis 1615. In one example, the memory cell strings 1611 include NAND memory cell strings. The example of FIG. 16 shows the memory cell strings 1611 as substantially vertical memory cell strings oriented along vertical axis 1617. Although substantially straight, substantially vertical memory cell strings 1611 are used as an example, other memory cell string configurations such as lateral, or U-shapes memory cell strings 1611 may be used in accordance with embodiments of the present invention.

The memory cell strings 1611 are coupled between a source 1612 and a data line 1614. In the example of FIG. 16, a memory cell region 1620 is located in a middle of the memory cell strings 1611. A source select gate 1616 is shown located between the memory cell region 1620 and the source 1612. In one example, a drain select gate 1618 is located between the memory cell region 1620 and the data line 1614.

A data detector 1640 is also shown in FIG. 16. In one example, the data detector 1640 is a shared data detector (in this case shared between a number of data lines of the same array as opposed to data lines of different arrays). In FIG. 16, for example, the data detector 1640 is selectably coupled to a first data line 1634 through detector plate 1642 and switches such as switch 1646, and is further selectably coupled to second, third and fourth data lines (not currently labeled) through detector plate 1642 and switches such as switch 1646. By using a shared data detector 1640, chip area can be saved, and device density can be improved. By using a detector plate such as detector plate 1642, chip area may be further saved by selectably coupling a data detector 1640 to more than one data line of the same array 1630. In the example shown in FIG. 16, each detector plate 1642, 1644 is selectably coupled to four adjacent data lines by switches. Four adjacent data lines are used as an example. Other numbers of data lines may be selectably coupled to a detector plate in other examples.

An inhibit voltage source 1650 is also shown in FIG. 16. In one example, the inhibit voltage source 1650 is a shared inhibit voltage source 1650. In FIG. 16, the inhibit voltage source 1650 is selectably coupled to the first data line 1634 through inhibit source plate 1652 and switch 1656. In one example, the inhibit voltage source 1650 is also selectably coupled to the second, third, fourth, sixth, seventh and eighth data lines (not currently labeled). Similar to the detector plate described above, by using an inhibit source plate 1652, chip area may be further saved by selectably coupling the inhibit voltage source 1650 to more than one data line of the same array 1630 (and possibly to data lines, such as data line 1614, of other arrays).

By using a shared inhibit voltage source 1650, chip area can be saved, and device density can be improved. By using selective coupling of the data detector 1640 and the inhibit voltage source 1650, a selected memory cell string, or groups of memory cell strings within the plurality of stacked arrays can be inhibited while another memory cell string within the plurality of stacked arrays utilize the data detector 1640.

In one example the data plate 1642 and the inhibit source plate 1652 may selectably couple to different numbers of data lines of the same array 1630. As a result, in the example of FIG. 16, a single inhibit source plate 1652 is shown coupled to a number of data lines of the second array 1630, while multiple data plates (including data plate 1642) are coupled to the same number of data lines of the second array 1630. An inhibit voltage source 1650 may be able to effectively drive a voltage to a large number of data lines, while a given data detector 1640 may be limited in a number of data lines that it can effectively service. In such a configuration, it may be desirable to have a single inhibit source plate 1652 selectably coupled to a number of data lines, while multiple data plates 1642 are selectably coupled to the same data lines.

Similar to the example from FIGS. 14 and 15, in one example the data detector 1640 is selectably coupled to the data lines (e.g., data line 1634) through a switch (e.g., switch 1646). The use of switches provides efficiency in manufacturing. Switch 1646 also includes at least one select gate 1647, similar to other select gates 1618 already being formed within the arrays 1610, 1630. As with the data detector 1640, in one example, the inhibit voltage source 1650 is selectably coupled to the data lines (e.g., data line 1634) through switches, such as switch 1656.

Figure 17:
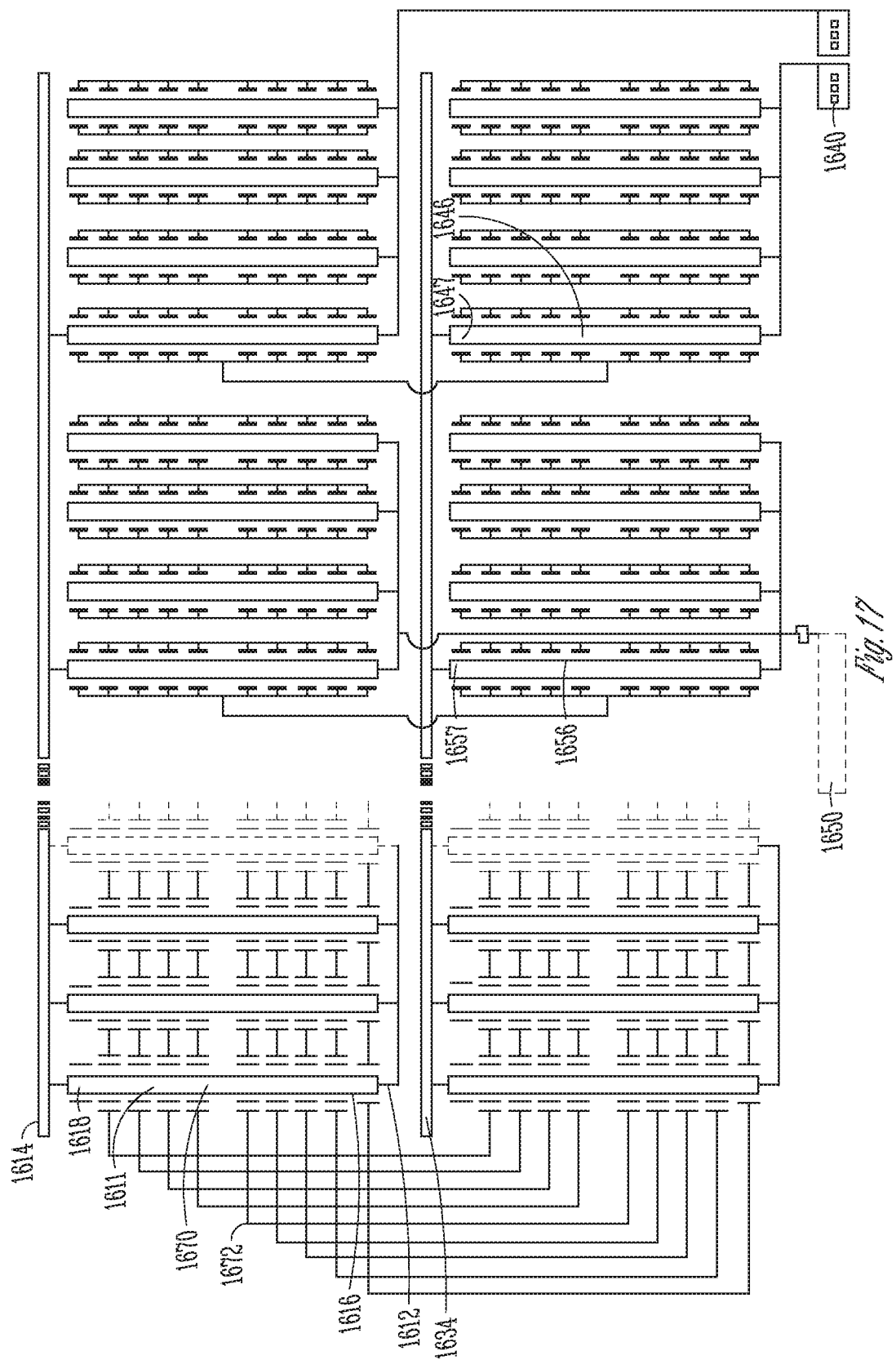
FIG. 17 shows a schematic diagram of the memory device from FIG. 16 according to an embodiment of the invention.

FIG. 17 shows a block diagram of portions of the apparatus 1600 from FIG. 16. The source select gate 1616 is again shown located between the memory cell region 1620 and the source 1612. The drain select gate 1618 is again shown located between the memory cell region 1620 and the data line 1614. A number of individual memory cells 1670 are shown along the vertical axis of the memory cell string 1611. A number of access lines 1672 (e.g. wordlines) are shown to operate each of the individual memory cells 1670 in the memory cell string 1611.

The inhibit voltage source 1650 and the data detector 1640 are further shown in FIG. 17, selectably coupled to the data line 1634 by respective switches 1656, 1646. By appropriate selection, using select gates 1657 and 1647, a memory cell string coupled to the data line 1634 can be either inhibited from electrical disturbance, or coupled to data detector 1640 to have a data state read.

Figure 18:
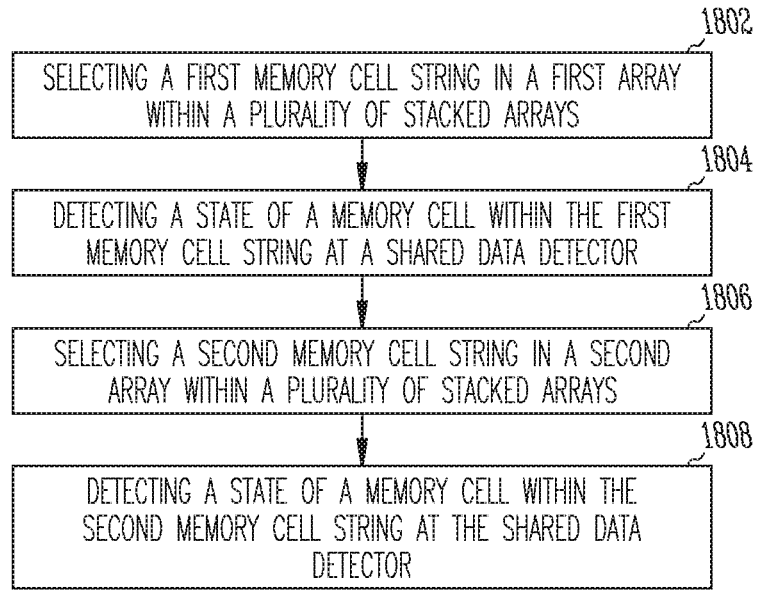
FIG. 18 shows a flow diagram of an example method according to an embodiment of the invention.

FIG. 18 shows an example method of operation that may be used with selected apparatus examples described. In operation 1802, a first memory cell string is selected in a first array within a plurality of stacked arrays. In operation 1804, the data state of a memory cell within the first memory cell string is detected at a shared data detector. In operation 1806, a second memory cell string is selected in a second array within a plurality of stacked arrays. In operation 1808, the data state of a memory cell within the second memory cell string is detected at the shared data detector.

Figure 19:
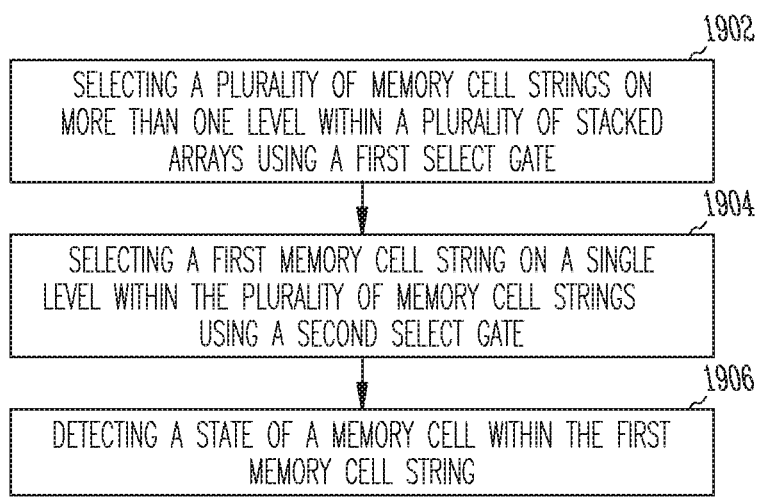
FIG. 19 shows a flow diagram of an example method according to an embodiment of the invention.

FIG. 19 shows another example method of operation that may be used with selected apparatus examples described. In operation 1902, a plurality of memory cell strings are selected across more than one array within a plurality of stacked arrays using a first select gate. In operation 1904, a memory cell string of the selected plurality of memory cell strings is selected using a second select gate. In operation 1906, the data state of a memory cell within the selected memory cell string is detected.

Figure 20:
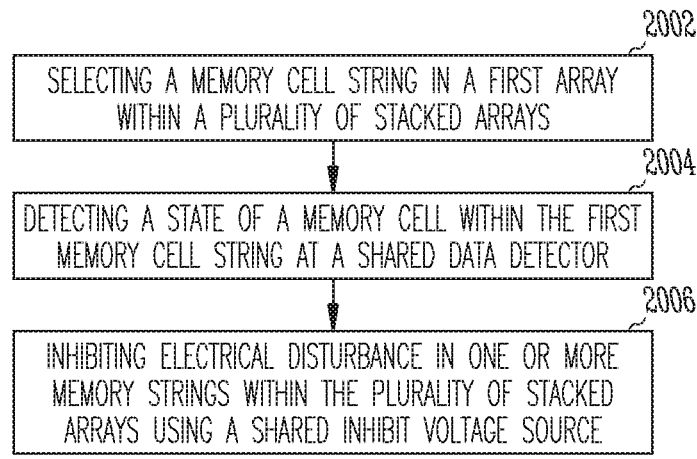
FIG. 20 shows a flow diagram of an example method according to an embodiment of the invention.

FIG. 20 shows another example method of operation that may be used with selected apparatus examples described. In operation 2002, a first memory cell string is selected in an array of a plurality of stacked arrays. In operation 2004, the data state of a memory cell within the first memory cell string is detected at a shared data detector. In operation 2006, electrical disturbance is inhibited in a second memory cell string in the plurality of stacked arrays using a shared inhibit voltage source.

Figure 21:
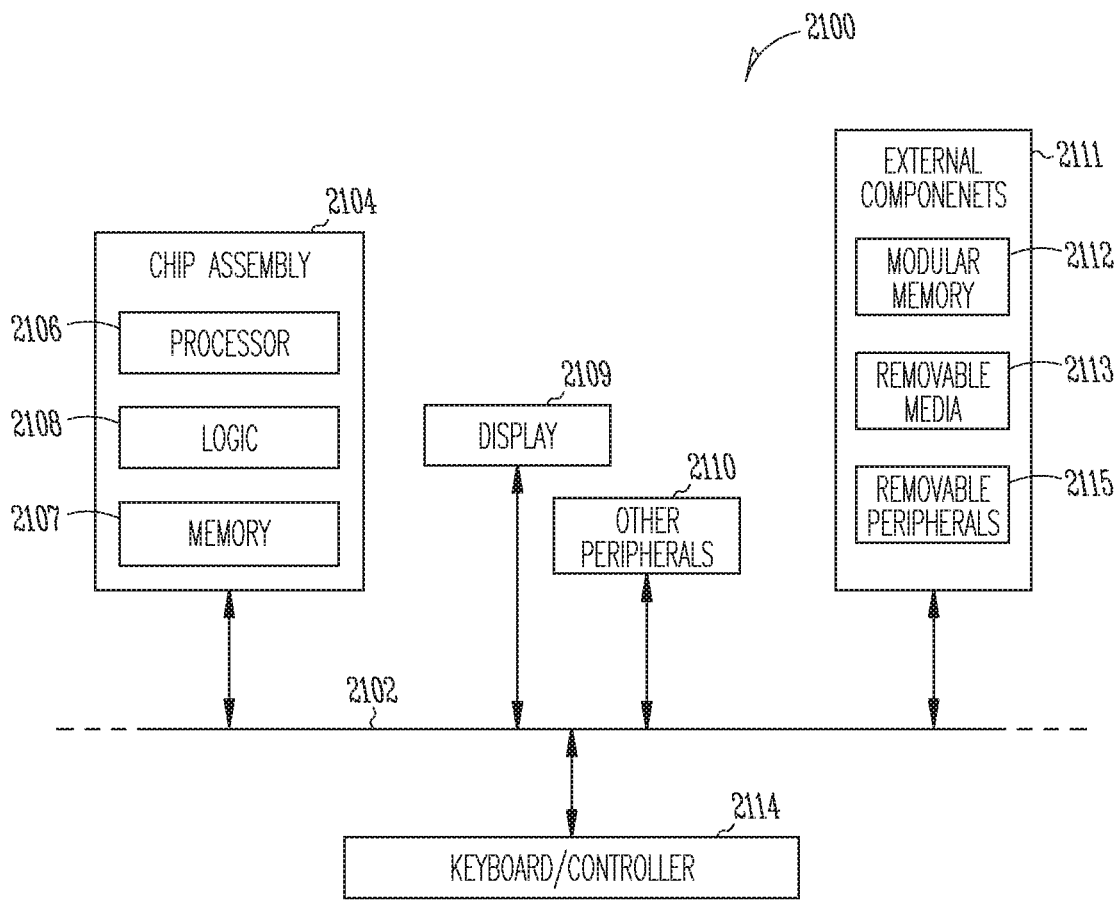
FIG. 21 shows an information handling system, including a memory device according to an embodiment of the invention.

An embodiment of an apparatus such as a computer is included in FIG. 21 to show an embodiment of a high-level device application. FIG. 21 is a block diagram of an information handling system 2100 incorporating at least one chip or chip assembly 2104 that includes a memory device 307 according to an embodiment of the invention. In one example, the memory device 307 includes a plurality of stacked arrays of memory cell strings as described in any of the embodiments previously described.

The information handling system 2100 shown in FIG. 21 is merely one example of a system in which the present invention can be used. Other examples include, but are not limited to, personal data assistants (PDAs), video game consoles, telephones, MP3 players, aircraft, satellites, military vehicles, etc.

In this example, information handling system 2100 comprises a data processing system that includes a system bus 2102 to couple the various components of the system. System bus 2102 provides communications links among the various components of the it handling system 2100 and may the implemented as a single bus, as a combination of busses, or in any other suitable manner.

Chip assembly 2104 is coupled to the system bus 2102. Chip assembly 204 may include any circuit or operably compatible combination of circuits. In one embodiment, chip assembly 2104 includes a processor 2106 that can be of any type. As used herein, "processor" means any type of computational circuit such as, but not limited to, a microprocessor, a microcontroller, a graphics processor, a digital signal processor (DSP), or any other type of processor or processing circuit. Multiple processors such as "multi-core" devices are also within the scope of the invention.

In one embodiment, a memory device 2107, including any memory device or array of devices described previously, is included in the chip assembly 2104. Those of ordinary skill in the art will recognize that a wide variety of memory device configurations may be used in the chip assembly 2104. Acceptable types of memory chips include, but are not limited to, non-volatile memory configurations such as NAND memory or NOR memory.

In one embodiment, additional logic chips 2108 other than processor chips are included in the chip assembly 2104. An example of a logic chip 2108 other than a processor includes an analog to digital converter. Other circuits on logic chips 2108 such as custom circuits, an application-specific integrated circuit (ASIC), etc. are also included in one embodiment of the invention.

Information handling system 2100 may also include an external memory 2111, which in turn can include one or more memory elements suitable to the particular application, such as one or more hard drives 2112, and/or one or more drives that handle removable media 2113 such as compact disks (CDs), digital video disks (DVDs), flash drives and the like. A memory constructed as described in any of the previous examples can be included in the external memory 2111 of the information handling system 2100.

Information handling system 2100 may also include a display device 309 such as a monitor, additional peripheral components 2110, such as speakers, etc. and a keyboard and/or controller 2114, which can include a mouse, touch screen, or any other device that permits a system user to input information into and receive information from the information handling system 2100.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. An apparatus, comprising:
multiple stacked memory arrays, including a first array of memory cell strings and a second array of memory cell strings stacked over the first array, each memory cell string extending vertically, and including multiple memory cells; and
a data plate associated with the first array and the second array, the data plate extending in a horizontal plane and being located between the first array and the second array, and the data plate being shared by memory cell strings in multiple rows and in multiple columns of the first array and in multiple rows and in multiple columns of the second array,
wherein the first and second memory arrays are configured in multiple blocks, and wherein the multiple blocks each includes a memory cell string from the first array and a memory cell string from the second array.

2. The apparatus of claim 1, wherein the memory cell strings include NAND memory cell strings.

3. The apparatus of claim 1, wherein each of the memory cell strings includes a memory cell region, with a drain select gate disposed between the memory cell region and a data plate to which the memory cell string is coupled.

4. The apparatus of claim 3, wherein the drain select gate comprises multiple hierarchical select gates coupled between the memory cell region of the memory cell string and the data plate to which the memory cell string is coupled.

5. The apparatus of claim 1, wherein each of the memory cell strings includes a source select gate disposed between a memory cell region and a source to which the memory cell string is coupled.

6. The apparatus of claim 1, further comprising:
for each of the memory cell strings associated with the data plate, multiple select gates coupled between a memory cell region of the memory cell string and the data plate.

7. The apparatus of claim 1, wherein the multiple select gates includes a first select gate configured to select at least one block of the multiple blocks.

8. An apparatus, comprising:
multiple stacked memory arrays, including a first array of vertical memory cell strings and a second array of vertical memory cell strings over the first array; and
a data plate associated with the first array and the second array, the data plate extending in a horizontal plane and being located between the first array and the second array, and the data plate being shared by memory cell strings in multiple rows and in multiple columns of the first array and in multiple rows and in multiple columns of the second array.

9. The apparatus of claim 8, wherein a block in a respective row of blocks includes a memory cell string from the first array and a memory cell string from the second array.

10. The apparatus of claim 8, wherein the memory cell strings include NAND memory cell strings.

11. The apparatus of claim 8, wherein each memory cell string includes a memory cell region and a drain select gate between the memory cell region of the string and the data plate to which the string is coupled.

12. The apparatus of claim 8, wherein each memory cell string includes a memory cell region and a source select gate between the memory cell region of the string and a source to which the string is coupled.

13. The apparatus of claim 8, wherein the memory strings of the second array coupled to the shared data plate are substantially vertically aligned with memory strings of the first array coupled to the shared data plate.

14. A method, comprising:
selecting a first vertical memory cell string in a first array including multiple vertical memory cell strings, the first array stacked over a second array including multiple vertical memory cell strings, the first array being disposed over the second array, wherein a shared data plate extends in a horizontal plane and is located between the first array and the second array, wherein the shared data plate is shared by memory cell strings in multiple rows and in multiple columns of the first array and by memory cell strings in multiple rows and in multiple columns of the second array;
detecting a first data state of a memory cell within the first vertical memory cell string at a shared data detector;
selecting a second vertical memory cell string in the second array; and
detecting a second data state of a vertical memory cell within the second vertical memory cell string at the shared data detector,
wherein a block in a respective row of blocks includes the first vertical memory cell string from the first array and the second vertical memory cell string from the second array.

15. The method of claim 14, wherein memory cell strings of the first array are coupled between a first source and a shared data plate.

16. The method of claim 14, wherein memory cell strings in multiple rows and columns of the second array are coupled between a second source and the shared data plate.

17. The method of claim 14, wherein the memory cell strings include NAND memory cell strings.

18. The method of claim 14, wherein detecting the first data state includes detecting the first data state through the shared data plate.

19. The method of claim 14, wherein detecting the second data state includes detecting the second data state through the shared data plate.

20. The method of claim 14, wherein the memory strings of the second array coupled to the shared data plate are substantially vertically aligned with memory strings of the first array coupled to the shared data plate.

* * * * *